(12) United States Patent
Ohki et al.

(10) Patent No.: US 8,389,351 B2
(45) Date of Patent: Mar. 5, 2013

(54) METHOD FOR FABRICATING SEMICONDUCTOR DEVICE

(75) Inventors: Toshihiro Ohki, Kawasaki (JP); Masahito Kanamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/282,812

(22) Filed: Oct. 27, 2011

(65) Prior Publication Data
US 2012/0149161 A1    Jun. 14, 2012

(30) Foreign Application Priority Data

Dec. 10, 2010   (JP) .................................. 2010-276380

(51) Int. Cl.
*H01L 21/336* (2006.01)
(52) U.S. Cl. . 438/197; 438/172; 438/963; 257/E21.403; 257/E21.409
(58) Field of Classification Search ............. 438/167, 438/172, 197, 270, 963; 257/194, E21.403, 257/E21.409
See application file for complete search history.

(56) References Cited

U.S. PATENT DOCUMENTS

| | | | | |
|---|---|---|---|---|
| 5,843,849 A | * | 12/1998 | Hoshino et al. | 438/738 |
| 7,419,862 B2 | * | 9/2008 | Lim et al. | 438/197 |
| 7,811,872 B2 | * | 10/2010 | Hoshi et al. | 438/172 |
| 7,821,036 B2 | * | 10/2010 | Ehara | 257/195 |
| 7,955,984 B2 | * | 6/2011 | Ohki | 438/706 |
| 2010/0210080 A1 | * | 8/2010 | Nomura et al. | 438/197 |

FOREIGN PATENT DOCUMENTS

JP     2002-359256 A1    12/2002

* cited by examiner

*Primary Examiner* — Tuan N. Quach
(74) *Attorney, Agent, or Firm* — Kratz, Quintos & Hanson, LLP

(57) ABSTRACT

A method for fabricating a semiconductor device is disclosed. A resist pattern is formed on a surface of a semiconductor layer in which a first layer and a second layer are sequentially formed on a substrate. A gate recess is formed by removing a part or the entire second layer in an opening area of the resist pattern. The resist pattern is removed. A dry etching residue attached to a bottom surface and lateral surfaces of the gate recess is removed after the resist pattern is removed. An insulating film is formed on the bottom surface, the lateral surfaces, and the semiconductor layer after the dry etching residue is removed. A gate electrode is formed via the insulating film on an area where the gate recess is formed. A source electrode and a drain electrode are formed on the semiconductor layer.

20 Claims, 22 Drawing Sheets

METHOD FOR FABRICATING SEMICONDUCTOR DEVICE

CROSS-REFERENCE TO RELATED APPLICATIONS

This patent application is based upon and claims the benefit of priority of the prior Japanese Patent Application No. 2010-276380 filed on Dec. 10, 2010, the entire contents of which are incorporated herein by reference.

FIELD

The embodiment discussed herein is related to a method for fabricating a semiconductor device.

BACKGROUND

Since a material formed from GaN, AlN, InN, or their mixed-crystals, which is used in a nitride semiconductor, has a wide band gap, the material has been used for a high power electronic device, a short-wavelength light emitting device, or the like. Technology related to an FET (Field Effect Transistor), and in particular, an HEMT (High Electron Mobility Transistor) as a high power electronic device has been developed. The HEMT using the nitride semiconductor is used for a high power high efficiency amplifier, a high power switching device, and the like.

The HEMT used for the above-described applications is desired to be in a normally-off state, and to have a high withstand voltage, and the like. In particular, since the normally-off state is important for safe operation, various methods to achieve this have been considered. As one of the methods for a normally-off HEMT, a technology is presented to form a gate recess by removing a part of a semiconductor layer immediately under a gate electrode. In a recessed-gate structure formed by this method, advantageously, a threshold voltage is retained at positive without increasing a resistance element between electrodes. Also, for a normally-off semiconductor device used for a power application, a high drain breakdown voltage and a high gate breakdown voltage have been desired. Accordingly, in a horizontal structure of the FET and HEMT, a MIS (Metal Insulator Semiconductor) structure forming an insulating film to be a gate insulating film is applied. As described above, a combined structure of the recessed-gate structure and the MIS structure is applied for the HEMT using a semiconductor material related to GaN, in order for the semiconductor device to be suitable for the power application.

However, in the HEMT having the above-described MIS structure, there is a case where the threshold voltage changes in an operation of a transistor due to an interfacial state between a semiconductor and an insulating film which will be the gate insulating film, quality of the insulating film, and the like.

It is considered that when an expected trap level is formed at an interface between the semiconductor and the insulating film, or at the insulating film due to the interfacial state and the like, an electron is trapped by the trap level, and a distribution of electrons is influenced in a 2DEG (Two-Dimensional Electron Gas) immediately under the gate electrode. As described above, when the threshold voltage changes, a current value and an on-resistance are changed when a transistor is operated. As a result, a uniform characteristic cannot be acquired. Also, a yield ratio is decreased.

SUMMARY

According to one aspect of the embodiment, there is provided a method for fabricating a semiconductor device, including forming a resist pattern on a surface of a semiconductor layer in which a first layer and a second layer are sequentially formed on a substrate; forming a gate recess by removing a part or the entire second layer in an opening area of the resist pattern; removing the resist pattern; removing a dry etching residue attached to a bottom surface and lateral surfaces of the gate recess after the resist pattern is removed; forming an insulating film on the bottom surface, the lateral surfaces, and the semiconductor layer after the dry etching residue is removed; forming a gate electrode via the insulating film on an area where the gate recess is formed; and forming a source electrode and a drain electrode on the semiconductor layer.

According to another aspect of the embodiment, there is provided a method for fabricating a semiconductor device, including forming a resist pattern on a surface of a semiconductor layer in which a first layer, a second layer, and a third layer are sequentially formed on a substrate; forming a gate recess by removing a part or the entire third layer in an opening area of the resist pattern; removing the resist pattern; removing a dry etching residue attached to a bottom surface and lateral surfaces of a gate recess after the resist pattern is removed; forming an insulating film on the bottom surface, the lateral surfaces, and the semiconductor layer after the dry etching residue is removed; forming a gate electrode via the insulating film on an area where the gate recess is formed; and forming a source electrode and a drain electrode on the semiconductor layer.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1A:
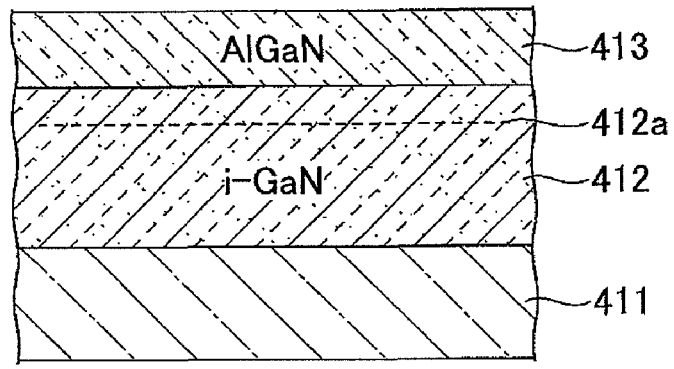
FIG. 1A through FIG. 1F illustrate process steps in a related method for fabricating a semiconductor device.

In the following, embodiments of the present invention will be described with reference to the accompanying drawings. It should be noted that members that are the same as those previously illustrated are indicated by the same reference numerals and the explanation thereof will be omitted.

First Embodiment

As one of factors causing a change of a threshold voltage in an HEMT (High Electron Mobility Transistor) having the above-described MIS structure, a residue is formed due to a dry etching or the like conducted when a gate recess is formed. In a state in which the residue remains, an insulating film is formed and the HEMT is fabricated. In the following, this factor causing the change of the threshold voltage will be described in detail based on a method for fabricating the HEMT having the MIS structure.

First, as illustrated in FIG. 1A, due to an epitaxial growth by a MOVPE (Metal Organic Vapor Phase Epitaxy) method, an i-GaN electron transit layer 412 and an AlGaN electron supply layer 413 are formed on an SiC substrate 411 being semi-insulative. Accordingly, the 2DEG 412a is formed on the i-GaN electron transit layer 412 in a vicinity of an interface between the i-GaN electron transit layer 412 and the AlGaN electron supply layer 413.

Figure 1B:
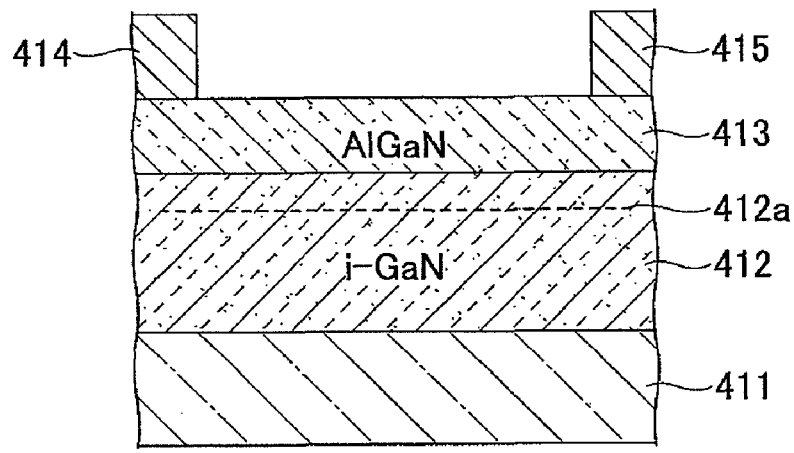

Next, as illustrated in FIG. 1B, a source electrode 414 and a drain electrode 415 are formed in a predetermined area in a surface of the AlGaN electron supply layer 413.

Figure 1C:
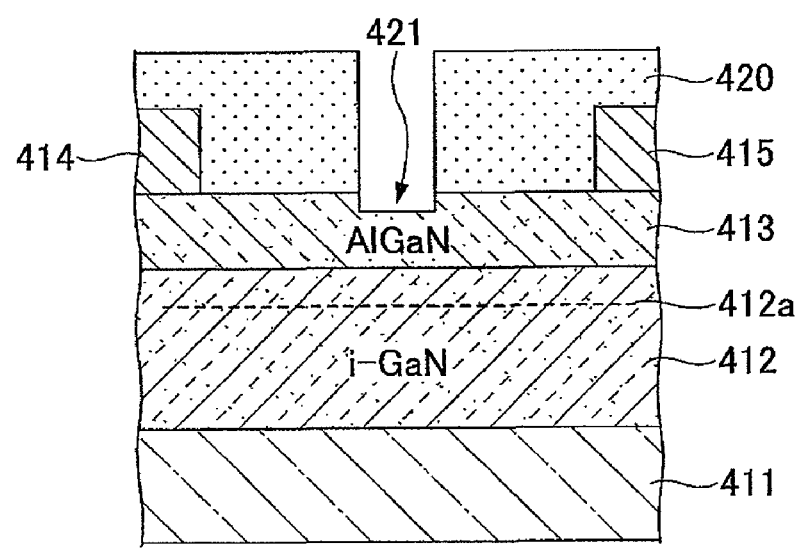

Next, as illustrated in FIG. 1C, a gate recess 421 is formed. In detail, after forming a resist pattern 420 including an opening area in an area where the gate recess 421 is to be formed, a dry etching such as a RIE (Reactive Ion Etching) or the like using chlorine gas (gas including chlorine chemistry) is conducted. By the dry etching, a part of the AlGaN electron supply layer 413 of an area where the resist pattern 420 is not formed can be removed. Thus, the gate recess 421 can be formed. It should be noted that in this case, a dry etching residue 422 is produced.

Figure 1D:
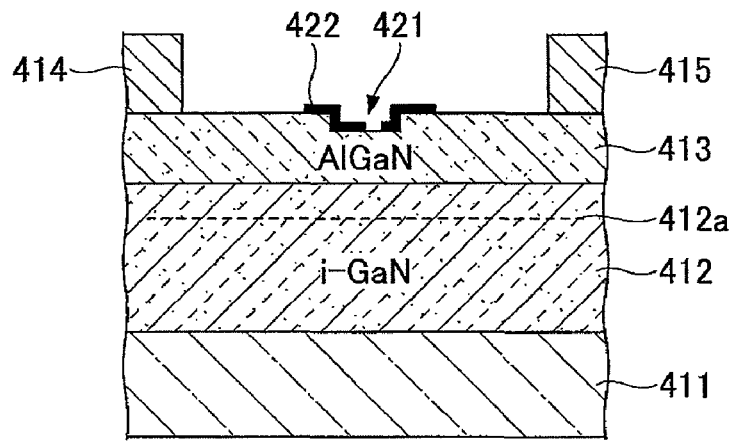

Next, as illustrated in FIG. 1D, the resist pattern 420 is removed by an organic solvent or the like. On a bottom surface and lateral surfaces of the gate recess 421, the dry etching residue 422 produced by the dry etching or the like is attached. The dry etching residue 422 is regarded as a product including Ga, Al, C, Cl, and the like, and cannot be removed by the organic solvent. Thus, the dry etching residue 422 remains attached to the bottom surface, the lateral surfaces, or the like of the gate recess 421. It may be considered that the dry etching residue 422 is generated mainly due to the dry etching by RIE or the like. Also, the dry etching residue 422 may be generated in a post-bake or the like for forming the resist pattern 420. In the first embodiment, a reactive layer, which is generated due to etching gas and oxygen, may be regarded as the dry etching residue 422, and the following process will be explained.

Figure 1E:
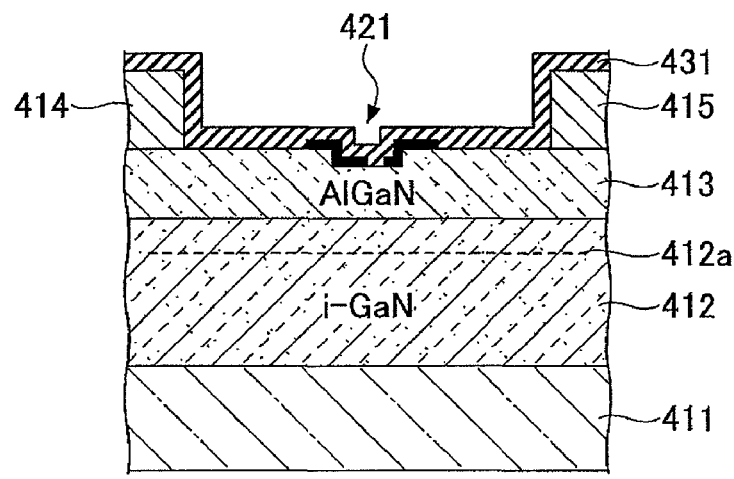

Next, as illustrated in FIG. 1E, an insulating film 431 is formed on a surface of the AlGaN electron supply layer 413 including the area where the gate recess 421 is formed.

Figure 1F:
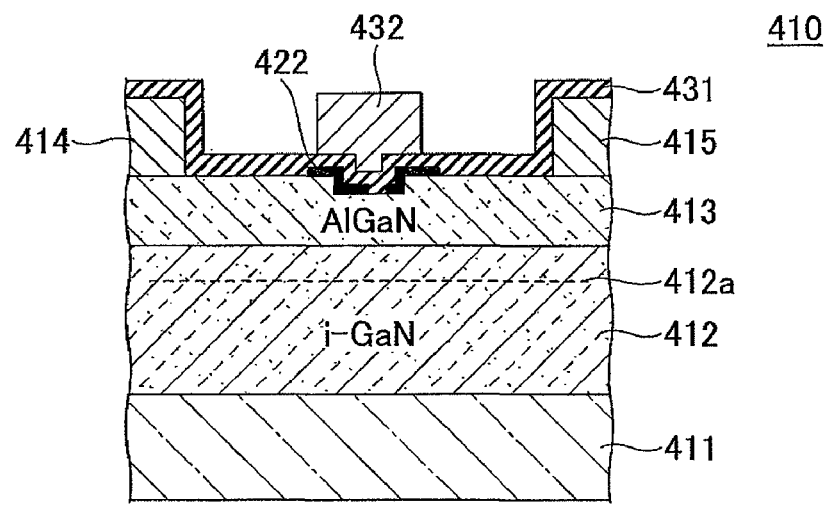

Next, as illustrated in FIG. 1F, a gate electrode 432 is formed via the insulating film 431 on the area where the gate recess 421 is formed. Thus, a semiconductor device 410 is fabricated.

In the HEMT having the MIS structure in which the semiconductor device 410 is fabricated in the above-described method, the insulating film 431 is formed in a state of retaining the dry etching residue 422 on the surface of the gate recess 421 below the insulating film 431 or the like. Thus, a trap level causing the dry etching residue 422 may be formed, an electron may be trapped and emitted due to the trap level, and a distribution of electrons of the 2DEG 412a immediately under the gate electrode 432 may be influenced. This causes a potential change of a threshold voltage. Moreover, since the dry etching residue 422 is not uniformly generated, it is inferred that a yield ratio may be also decreased.

The dry etching residue 422 can be removed by conducting cleaning or the like by using acid after the resist pattern 420 is removed. However, after the source electrode 414 and the drain electrode 415 are formed, for example, in a case of cleaning with acid to remove the dry etching residue 422, the source electrode 414 and the drain electrode 415 may be damaged. In this case, a characteristic of the HEMT of the MIS structure to be fabricated is deteriorated, and the yield ratio is decreased. In general, after the source electrode 414 and the drain electrode 415 are formed, a heat process with high temperature is conducted for the source electrode 414 and the drain electrode 415 to be brought into an ohmic-contact.

(Method for Fabricating Semiconductor Device)

In the following, a method for fabricating a semiconductor device will be described with reference to FIG. 2A through FIG. 2H.

Figure 2A:
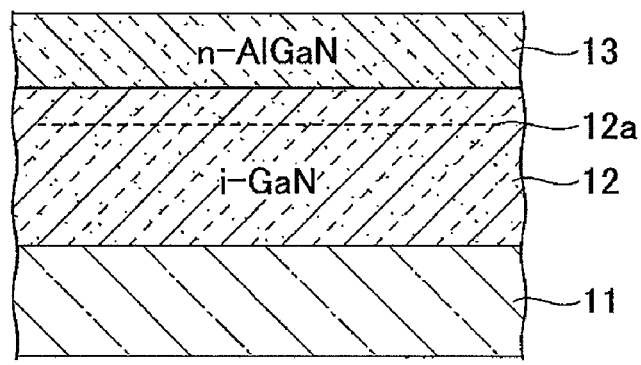
FIG. 2A through FIG. 2H illustrate process steps in of a method for fabrication the semiconductor device according to a first embodiment.

First, as illustrated in FIG. 2A, on a substrate 11 formed from SiC or the like being semi-insulative, due to epitaxial growth by the MOVPE, a semiconductor layer is formed by sequentially forming an electron transit layer 12 to be a first semiconductor layer, and an electron supply layer 13 to be a second semiconductor layer. The electron transit layer 12 is formed from i-GaN having approximately 3 μm in thickness. The electron supply layer 13 is formed from n-AlGaN having a thickness of approximately 30 nm. Si as an impurity element is doped so that an impurity concentration becomes $5 \times 10^{18}$ cm$^{-3}$. A 2DEG 12a is formed on the electron transit layer 12 in a vicinity of the interface between the electron transit layer 12 and the electron supply layer 13. After that, an element isolation region (not shown) is formed. In detail, a photoresist is applied to form the element isolation region. Then, through exposing and developing by the exposure device, a resist pattern having an opening area is formed on an area where the element isolation region is formed. After that, a dry etching using the gas including the chlorine chemistry is conducted. By forming an insulating film or conducting an ion implantation of a predetermined element to an area where the dry etching is conducted, the element isolation region is formed.

Figure 2B:
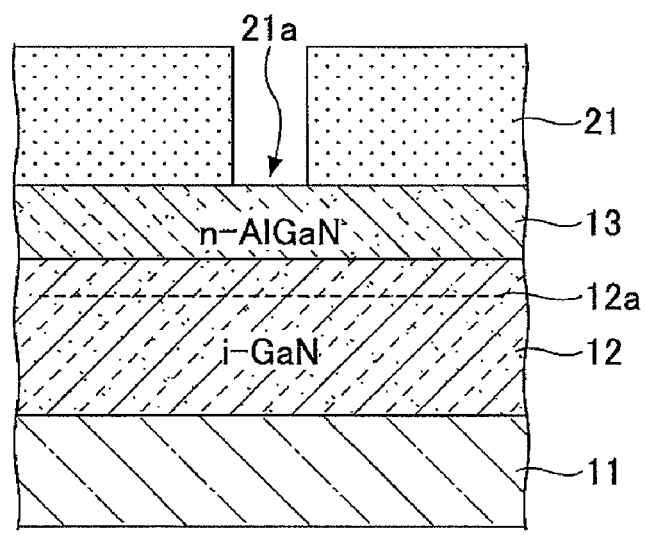

Next, as illustrated in FIG. 2B, the resist pattern 21 is formed on a surface of the electron supply layer 13. The resist pattern 21 is formed by applying a photoresist on the surface of the electron supply layer 13, and exposing and developing by the exposure device. By forming the resist pattern 21, the resist pattern 21 having the opening area 21a on the area where the gate recess 22 is to be formed which will be described.

Figure 2C:
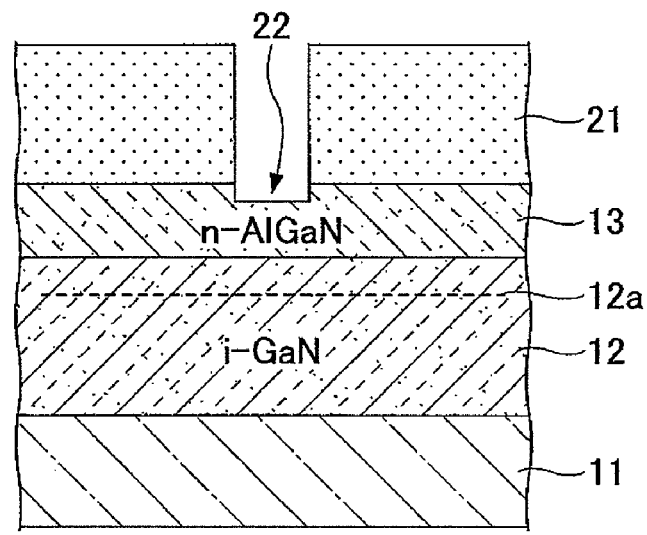

Next, as illustrated in FIG. 2C, by conducting the dry etching such as RIE or the like using the gas including the chlorine chemistry, the area where the resist pattern 21 is not formed, that is, a part of or the entire electron supply layer 13 in the opening area 21a is removed, so as to form the gate recess 22.

Figure 2D:
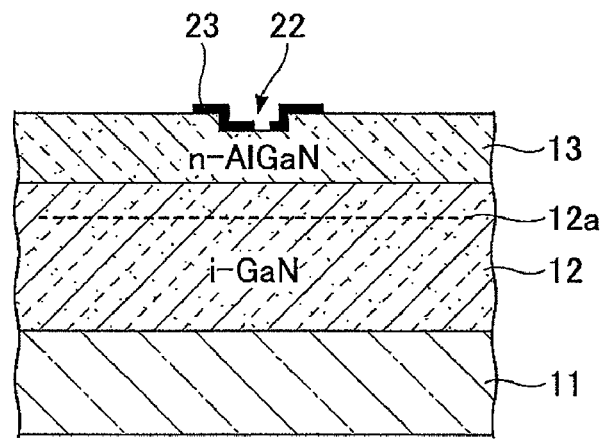

Next, as illustrated in FIG. 2D, the resist pattern 21 is removed by the organic solvent or the like. The resist pattern 21 is removed. However, a dry etching residue 23 generated by the dry etching such as RIE or the like remains in a state of being attached to the bottom surface, the lateral surfaces, or the like of the gate recess 22.

Figure 2E:
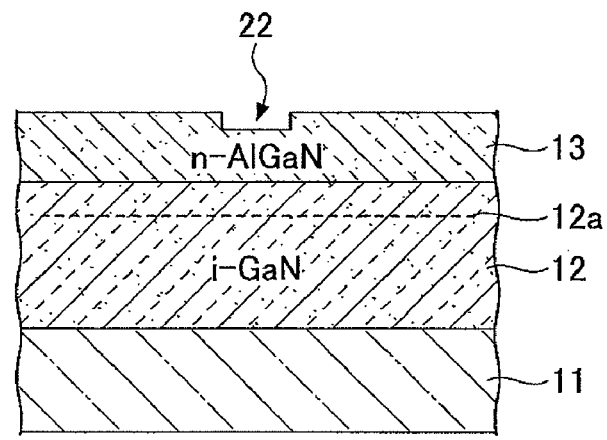

Next, as illustrated in FIG. 2E, the dry etching residue 23 attached to the bottom surface, the lateral surfaces, or the like of the gate recess 22 is removed. In detail, by using a water solution of potassium hydroxide, the dry etching residue 23 is removed. The dry etching residue 23 can be removed by an alkali treatment as well. Alternatively, the dry etching residue 23 can be removed by an acid treatment, an organic treatment, a water cleaning treatment, a superheated steam treatment, a super critical water treatment, a supercritical CO2 treatment, a heat treatment, a plasma treatment, or a ultraviolet treatment. Also, two or more of the above-described treatments can be combined.

As the acid treatment, a process may be applied with one or more selected from hydrochloric acid, hydrofluoric acid, nitric acid, sulfuric acid, phosphoric acid, boric acid, and mixtures of any of these acids with hydrogen peroxide.

Also, as the alkali treatment, a process may be applied with one or more selected from sodium hydroxide, ammonia, calcium hydroxide, tetramethyl ammonium hydroxide, as well as the potassium hydroxide, and mixtures of any of these alkalis with hydrogen peroxide.

Moreover, as the organic treatment, a process may be applied with one or more selected from alcohols, aldehydes, ketones, carboxylic acids, and derivatives thereof.

Moreover, it is preferable to conduct the heat treatment, a plasma treatment, and the ultraviolet treatment within a chamber of a deposition device used to form the insulating film 31 which will be described later.

The super critical water treatment is regarded as a treatment using water of a supercritical state at high temperature and high pressure. The supercritical CO2 treatment is regarded as a process using carbonic anhydride of the supercritical state at high temperature and high pressure.

Figure 2F:
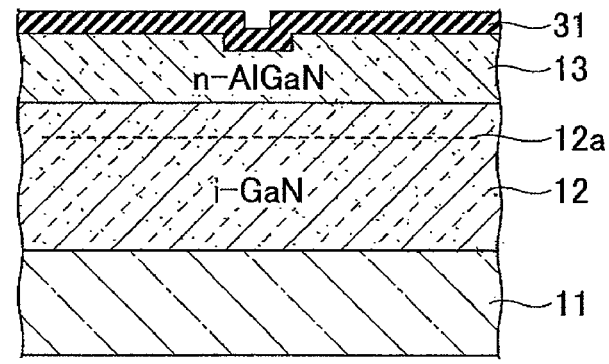

Next, as illustrated in FIG. 2F, the insulating film 31 is formed on the bottom surface and the lateral surfaces of the gate recess 22 and the electron supply layer 13. In the first embodiment, the insulating film 31 is formed so that an alumina ($Al_2O_3$) film is formed with a thickness of 2 nm to 200 nm. In detail, the alumina film is formed with 10 nm in thickness, as the insulating film 31. As a method for forming the insulating film 31, a CVD (Chemical Vapor Deposition), an ALD (Atomic Layer Deposition), a sputtering, and the like can be applied.

It should be noted that the insulating film 31 may be formed from oxides, nitrides, or oxynitrides of Si, Al, Hf, Zr, Ti, Ta, W, or the like, other than the above-described alumina.

Figure 2G:
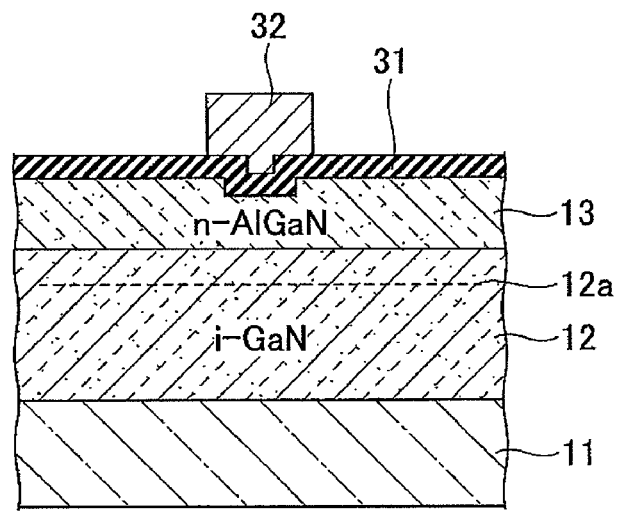

Next, as illustrated in FIG. 2G, a gate electrode 32 is formed via the insulating film 31 on the area where the gate recess 22 is formed. In detail, the photoresist is applied on the insulating film 31 and is exposed and developed by the exposure device. A resist pattern (not shown) having an opening area in the area where the gate electrode 32 is formed. After that, a Ni film having approximately 30 nm thickness and an Au film having approximately 400 nm thickness are sequentially formed by vacuum vapor deposition, whereby forming a metal film. Furthermore, after that, the metal film formed on the resist pattern is removed with the resist pattern by a lift-off using the organic solvent or the like. Thus, the gate electrode 32 is formed by the metal film formed on the area where the resist pattern is not formed.

Figure 2H:
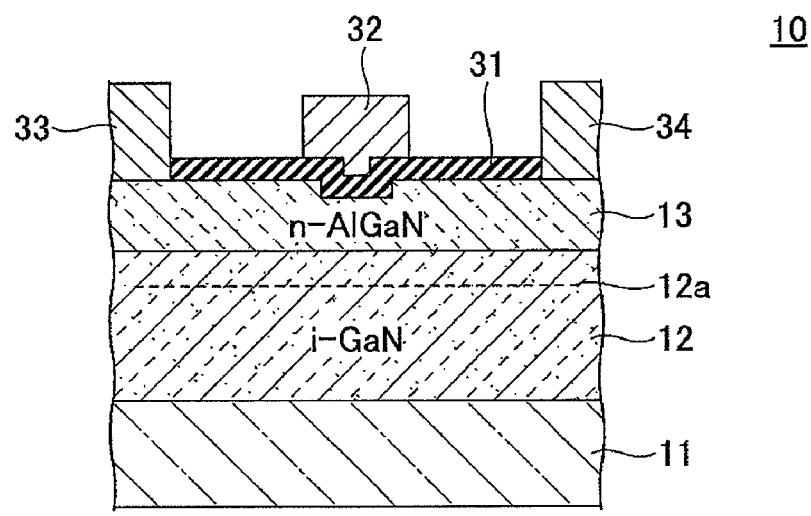

Next, as illustrated in FIG. 2H, a source electrode 33 and a drain electrode 34 are formed. In detail, the photoresist is applied on the surface of the insulating film 31, the resist pattern (not shown) having the opening area in the area where the source electrode 33 and the drain electrode 34 are formed by exposing and developing by the exposure device. After that, by conducting the dry etching such as RIE or the like using the gas including the chlorine chemistry, the insulating film 31 in the area where the resist pattern is formed is removed, the electron supply layer 13 is exposed, so that the opening area is formed. After that, the resist pattern is removed, the photoresist is applied on the surface and the like of the insulating film 31. The photoresist is exposed and developed by the exposure device. A resist pattern (not shown), which has an opening area in the area where the source electrode 33 and the drain electrode 34 are formed, is formed.

After that, a Ta film having approximately 20 nm thickness and an Al film having approximately 200 nm thickness are sequentially formed by the vacuum vapor deposition, whereby forming the metal film. After that, by conducting the lift-off using the organic solvent or the like, the metal film formed on the resist pattern is removed with the resist pattern. The source electrode 33 and the drain electrode 34 are formed by the metal film formed on the area where the resist pattern is formed. After that, by conducting the heat treatment at temperature of 400° C. to 1000° C., for example, at 550° C., an ohmic contact is made for the source electrode 33 and the drain electrode 34. A case of forming the resist pattern twice is described above. Alternatively, the resist pattern for forming the opening area to the insulating film 31 is also used as the resist pattern for forming the source electrode 33 and the drain electrode 34. In this case, the resist pattern is formed once. It should be noted that the source electrode 33 and the drain electrode 34 may be formed on the electron transit layer 12.

As described above, by the method for fabricating the semiconductor device in the first embodiment, it is possible to fabricate a semiconductor device 10.

The first embodiment can be applied for any structure for a field effect transistor having a gate recess and a gate insulating film. Also, a gate electrode, a source electrode, and a drain electrode may be formed by another method. In addition, if the ohmic contact is made, the heat treatment and the like are not required. Also, a step of the heat treatment may be included after the gate electrode is formed.

Figure 3:
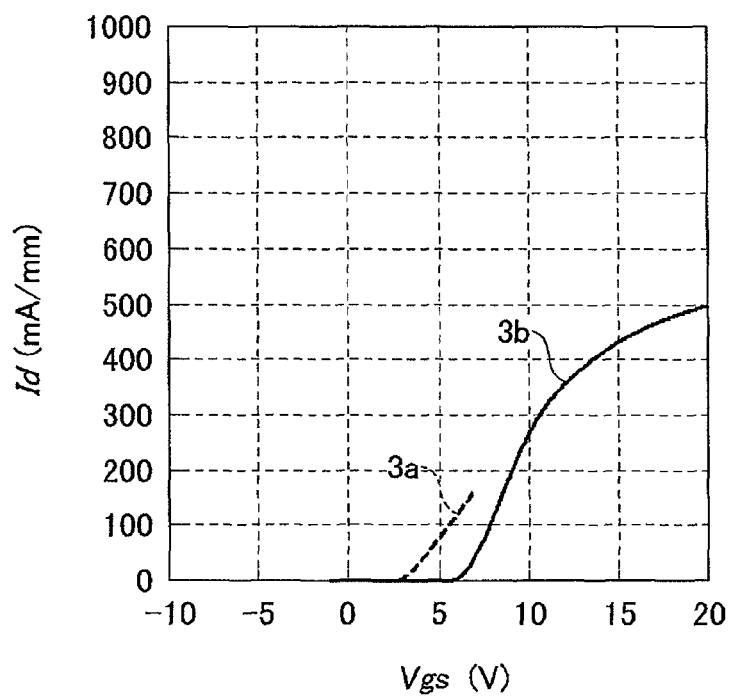
FIG. 3 is a diagram illustrating a correlation between a gate-source voltage and a drain current in the semiconductor device fabricated in the related method.
Figure 4:
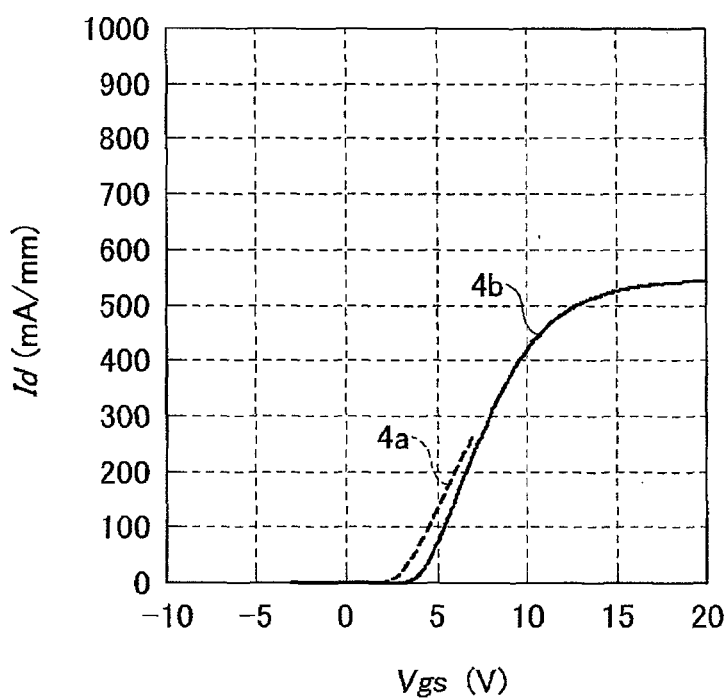
FIG. 4 is a diagram illustrating a correlation between a gate-source voltage and a drain current in the semiconductor device fabricated in the method according to the first embodiment.

Next, characteristics of the semiconductor 410 fabricated in the method illustrated in FIG. 1A through FIG. 1F and the semiconductor 10 fabricated in the method illustrated in FIG. 2A through FIG. 2H will be described with reference to FIG. 3 and FIG. 4. FIG. 3 illustrates a relationship between a gate-source voltage Vgs and a drain current Id in the semiconductor 410, and FIG. 4 illustrates a relationship between the gate-source voltage Vgs and the drain current Id in the semiconductor 10. In both case, first, a first measurement 3a and a first measurement 4a are conducted while the gate-source voltage Vgs is being applied at approximately 7 V, and then, the gate-source voltage Vgs is decreased. Then, a second measurement 3b and a second measurement 4b are conducted while the gate-source voltage Vgs is being applied again.

As illustrated in FIG. 3, in the semiconductor device 410, compared with the first measurement 3a, a threshold voltage in the second measurement 3b is shifted by approximately 3.10 V toward a positive direction. However, as illustrated in FIG. 4, in the semiconductor 10, compared with the first measurement 4a, the threshold voltage in the second measurement 4b is shifted by approximately 1.26 V toward the positive direction. That is, in the semiconductor 10 fabricated in the method according to the first embodiment, the threshold voltage is shifted less and is more stable than that in the semiconductor 410. In the method for fabricating the semiconductor according to the first embodiment, since a process for removing the dry etching residue is conducted after a recess formation, the dry etching residue does not exist. It is considered that an electron is trapped by a level causing the dry etching residue and the like.

Figure 5:
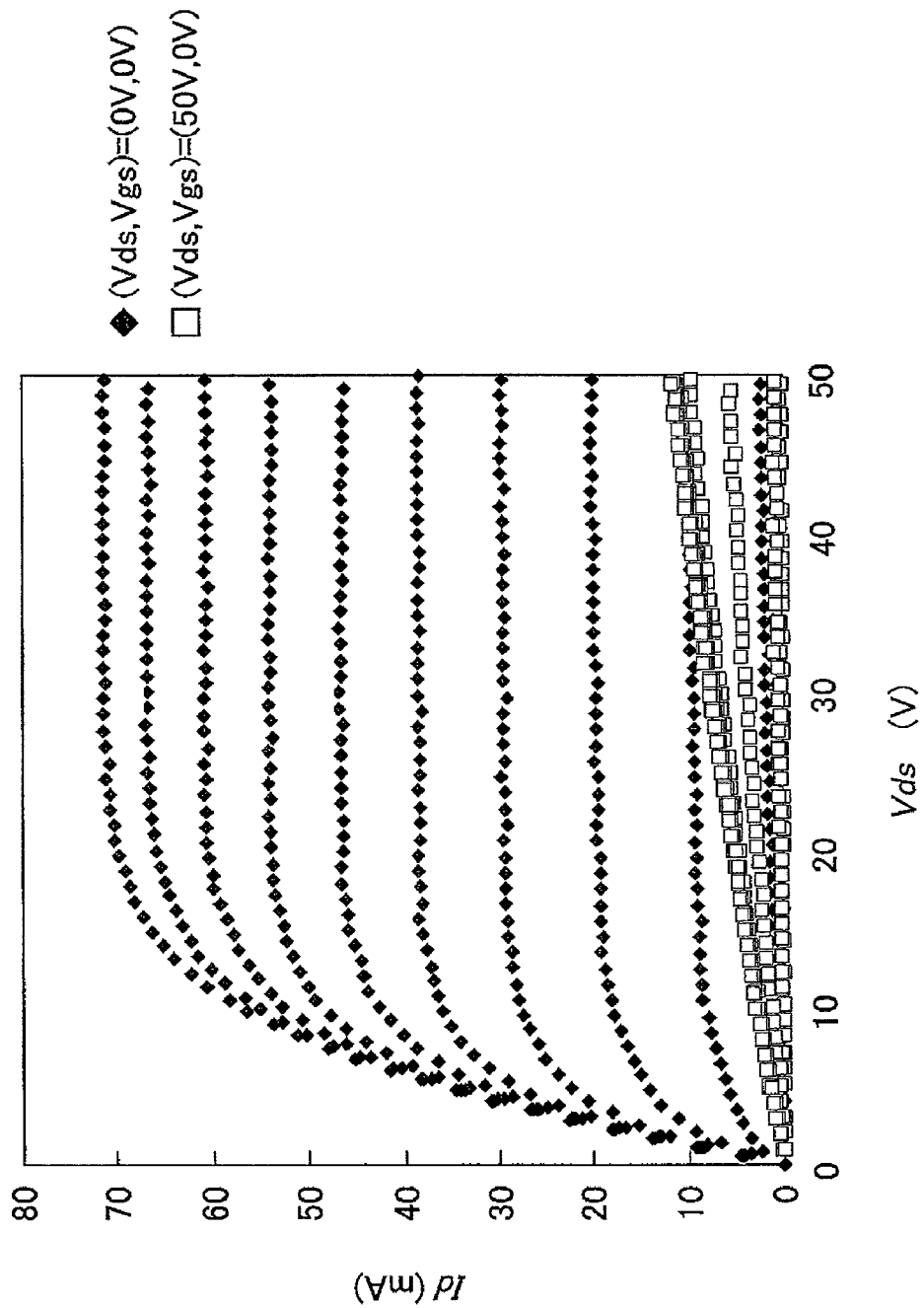
FIG. 5 is a diagram illustrating a correlation between a drain-source voltage and the drain current in the semiconductor device fabricated in the related method.
Figure 6:
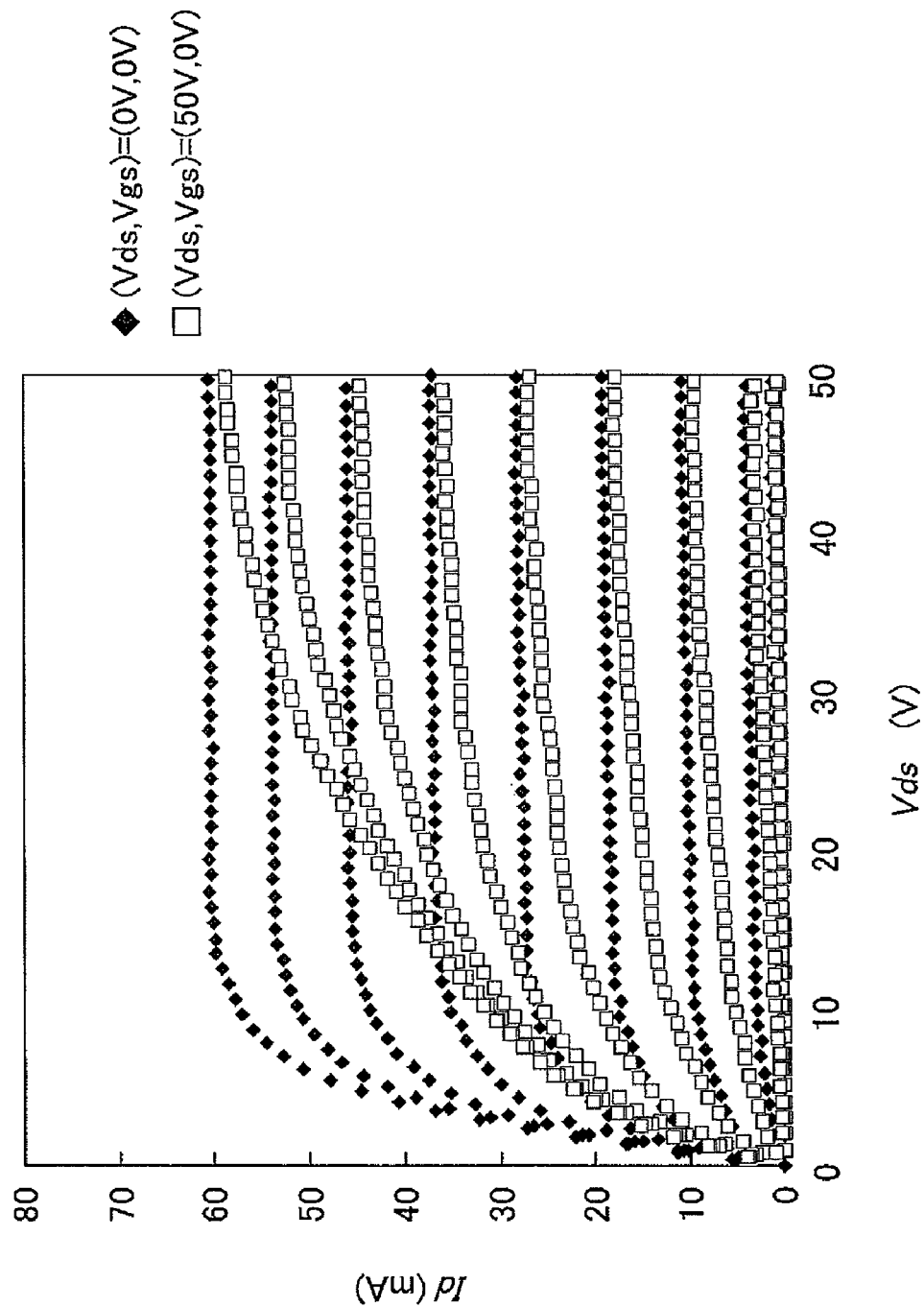
FIG. 6 is a diagram illustrating a correlation between the drain-source voltage and the drain current in the semiconductor device fabricated in the method according to the first embodiment.

Also, FIG. 5 illustrates a relationship between the drain-source voltage Vds and the drain current Id in the semiconductor device 410. FIG. 6 illustrates a relationship between the drain-source voltage Vds and the drain current Id in the semiconductor device 10. In a case in which the gate-source voltage Vgs is changed in both the semiconductor device 410 and the semiconductor device 10, the relationship between the drain-source voltage Vds and the drain current Id is illustrated. A case in which an initial bias point (Vds, Vgs) is (0 V, 0 V) and a case in which the initial bias point (Vds, Vgs) is (50 V, 0 V) are illustrated. In the semiconductor device 410, the drain current Id is low in the case in which the initial bias point (Vds, Vgs) is (50 V, 0 V), and greatly changes more than the case in which the initial bias point (Vds, Vgs) is (0 V, 0 V). A great current collapse phenomena is confirmed. On the contrary, in the semiconductor device 10 fabricated in the method according to the first embodiment, in the case in which the initial bias point (Vds, Vgs) is (50 V, 0 V), the drain current Id changes less, and the current collapse phenomena is suppressed. It can be regarded that in the method for fabricating the semiconductor device according to the first embodiment, since the process for removing the dry etching residue is conducted after the recess formation, the dry etching residue does not exist.

Second Embodiment

Next, a second embodiment will be described. A method for fabricating a semiconductor device according to the second embodiment will be described with reference to FIG. 7A through FIG. 7H.

Figure 7A:
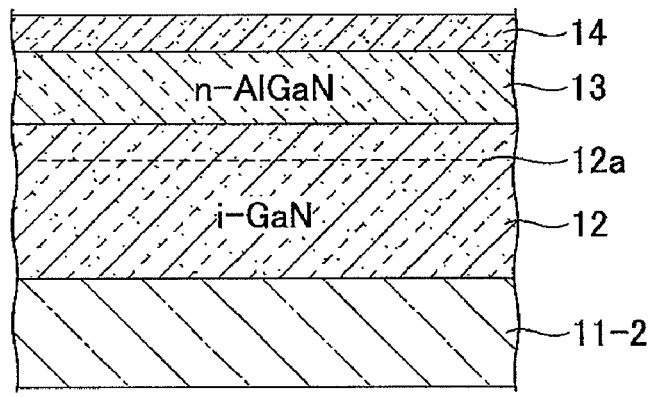
FIG. 7A through FIG. 7H illustrate process steps in a method for fabricating the semiconductor device according to a second embodiment.

First, as illustrated in FIG. 7A, on a substrate 11-2 formed from Si or the like, by the epitaxial growth due to the MOVPE, the electron transit layer 12 being a first semiconductor layer, the electron supply layer 13 being a second semiconductor layer, and a cap layer 14 being a third semiconductor layer are sequentially formed. The electron transit layer 12 is formed by i-GaN having approximately 3 μm thickness. The electron supply layer 13 is formed by n-AlGaN having approximately 30 nm thickness, and Si is doped as an impurity element so that the impurity concentration becomes $5 \times 10^{18}$ cm$^{-3}$. Also, the cap layer 14 is formed by n-GaN having approximately 10 nm thickness, and Si is doped as the impurity element so that the impurity concentration becomes $5 \times 10^{18}$ cm$^{-3}$. Accordingly, the 2DEG 12a is formed in the vicinity of the interface between the electron transit layer 12 and the electron supply layer 13. After that, the element isolation region, which is not shown, is formed. In detail, the photoresist for forming the element isolation region is applied, and exposed and developed by the exposure device. The resist pattern having the opening area is formed on the area where the element isolation region is to be formed. Furthermore, after that, the dry etching using the gas including the chlorine chemistry is conducted, and the insulating film is formed on an area where the dry etching is conducted. Alternatively, the element isolation region is formed by conducting the ion implantation of the predetermined element.

Figure 7B:
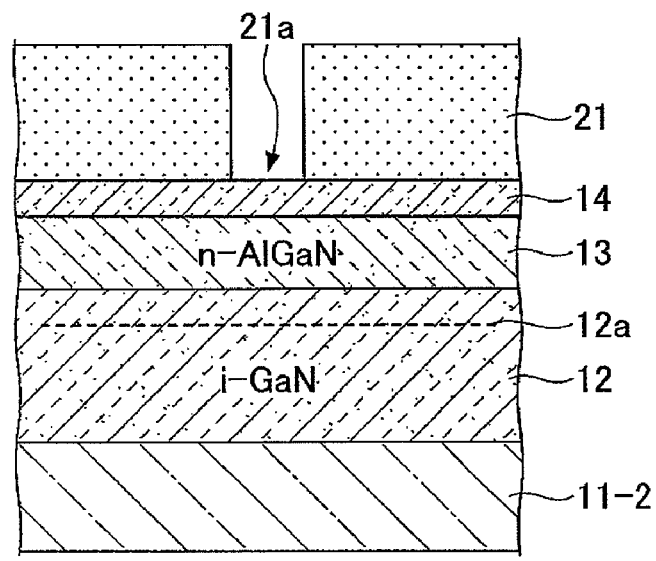

Next, as illustrated in FIG. 7B, the resist pattern 21 is formed on a surface of the cap layer 14. The resist pattern 21 is formed by applying the photoresist on the surface of the cap layer 14, and exposing and developing by the exposure device. Accordingly, the resist pattern 21 having the opening area 21a is formed on the area where a gate recess 221 is formed which will be described later.

Figure 7C:
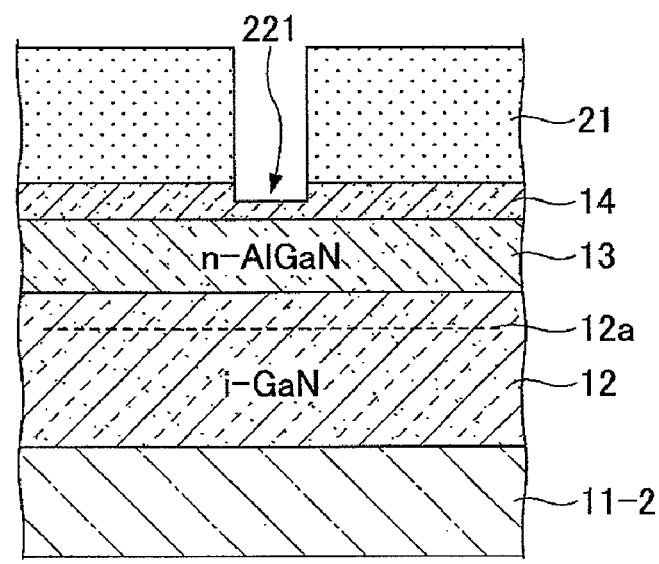

Next, as illustrated in FIG. 7C, by conducting the dry etching such as RIE or the like using the gas including the chlorine chemistry, the area where the resist pattern 21 is not formed, that is, a part of or the entire cap layer 14 in the opening area 21a is removed. The gate recess 221 is formed.

Figure 7D:
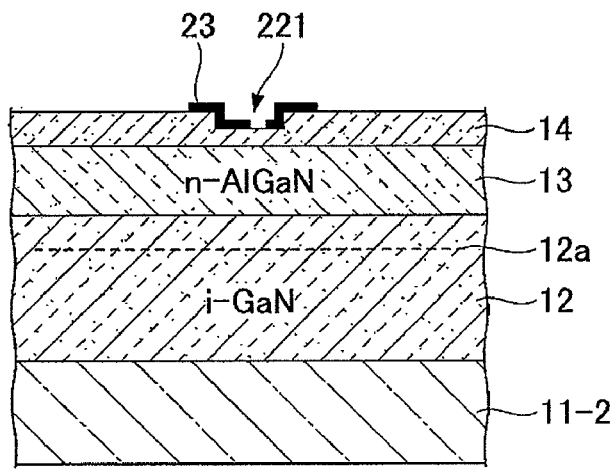

Next, as illustrated in FIG. 7D, the resist pattern 21 is removed by the organic solvent or the like. However, the dry etching residue 23 generated due to the dry etching such as RIE or the like remains in a state of being attached to the bottom surface, the lateral surfaces, and the like of the gate recess 221.

Figure 7E:
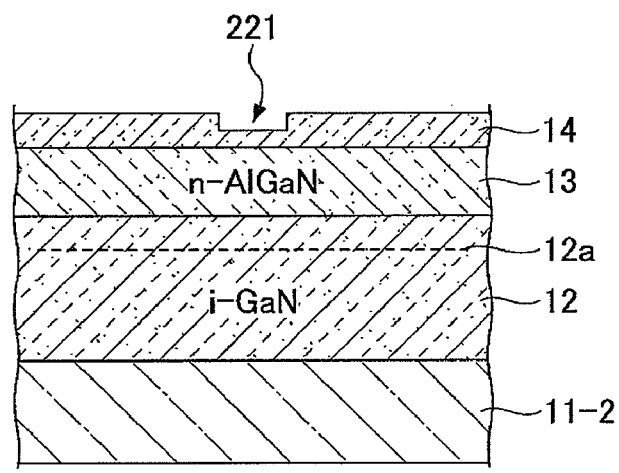

Next, as illustrated in FIG. 7E, by conducting the super critical water treatment and a hydrofluoric acid treatment, the dry etching residue 23 attached to the bottom surface, the lateral surfaces, and the like of the gate recess 221 is removed. In the dry etching residue 23, the reactive layer is removed by hydrofluoric acid, and others are removed by super critical water. The dry etching residue 23 can be removed by the acid treatment, the organic treatment, the water cleaning treatment, the superheated steam treatment, the super critical water treatment, the supercritical CO2 treatment, the heat treatment, the plasma treatment, or the ultraviolet treatment other than the above described method. Also, two or more the above treatments may be combined and successively conducted. It should be noted that the super critical water treatment is regarded as the treatment using water of a supercritical state at high temperature and high pressure.

Next, as illustrated in FIG. 7E, the insulating film 31 is formed on the bottom surface and the lateral surfaces of the gate recess 221 and the electron supply layer 13. In the second embodiment, the insulating film 31 is formed so that a tantalic oxide ($Ta_2O_5$) film is formed with 2 nm to 200 nm in thickness. In detail, the tantalic oxide film is formed with 50 nm in thickness, as the insulating film 31.

Figure 7F:
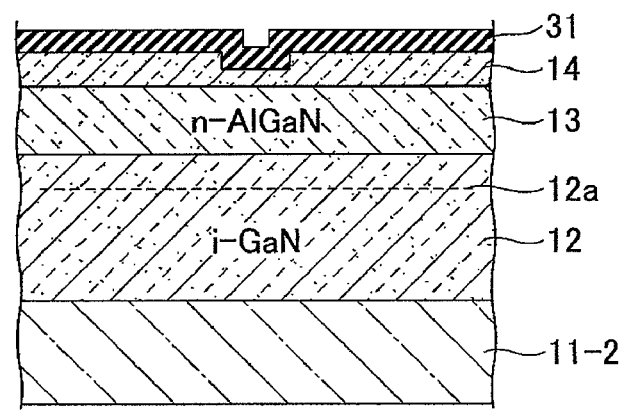
Figure 7G:
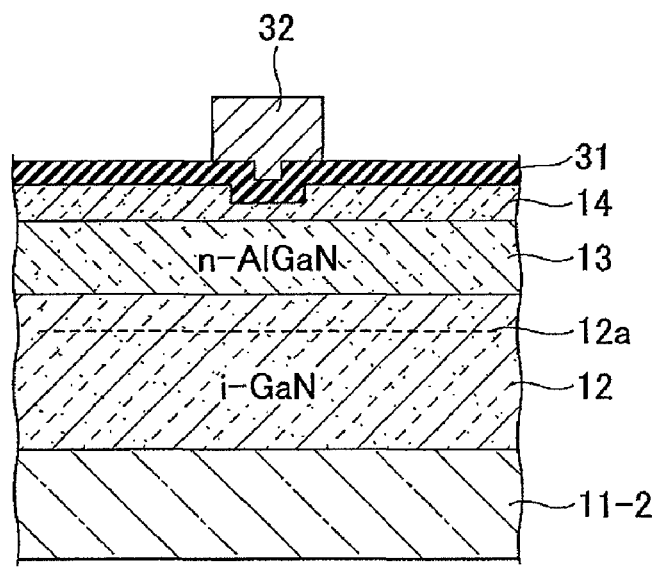

Next, as illustrated in FIG. 7F, the gate electrode 32 is formed via the insulating film 31 on the area where the gate recess 221 is formed. In detail, the photoresist is applied on the insulating film 31 and is exposed and developed by the exposure device. The resist pattern (not shown) having the opening area in the area where the gate electrode 32 is formed. After that, the Ni film having approximately 30 nm thickness and the Au film having approximately 400 nm thickness are sequentially formed by the vacuum vapor deposition, thereby forming a metal film. Furthermore, after that, the metal film formed on the resist pattern is removed with the resist pattern by a lift-off using the organic solvent or the like. Thus, the gate electrode 32 is formed by the metal film formed on the area where the resist pattern is not formed.

Figure 7H:
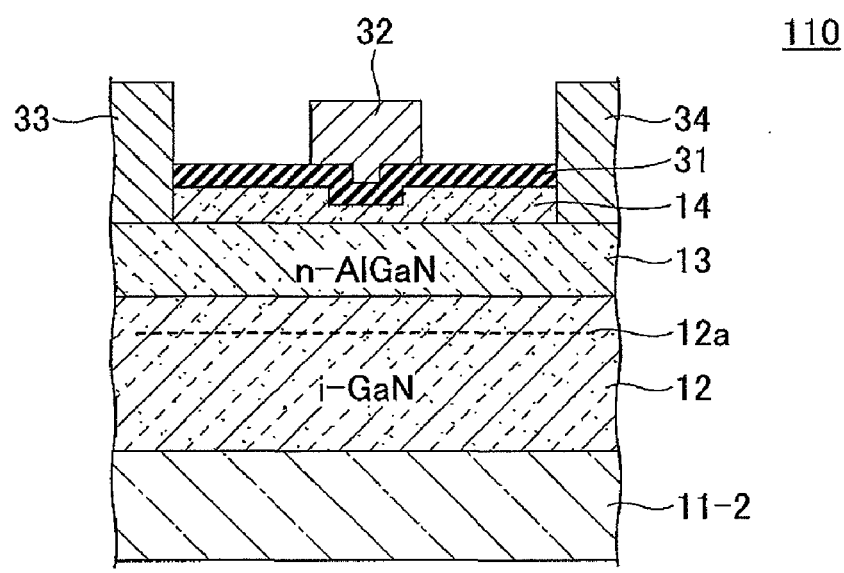

Next, as illustrated in FIG. 7H, the source electrode 33 and the drain electrode 34 are formed. In detail, the photoresist is applied on the surface of the insulating film 31, the resist pattern (not shown) having the opening area in the area where the source electrode 33 and the drain electrode 34 are formed by exposing and developing by the exposure device. After that, by conducting the dry etching such as RIE or the like using the gas including the chlorine chemistry, the insulating film 31 and the cap layer 14 in the area where the resist pattern is formed are removed, the electron supply layer 13 is exposed, so that the opening area is formed. After that, the resist pattern is removed, the photoresist is applied on the surface and the like of the insulating film 31. The photoresist is exposed and developed by the exposure device. A resist pattern (not shown), which has an opening area in the area where the source electrode 33 and the drain electrode 34 are formed, is formed.

After that, a Ta film having approximately 20 nm thickness and an Al film having approximately 200 nm thickness are sequentially formed by the vacuum vapor deposition, whereby forming the metal film. After that, by conducting the lift-off using the organic solvent or the like, the metal film formed on the resist pattern is removed with the resist pattern. The source electrode 33 and the drain electrode 34 are formed by the metal film formed on the area where the resist pattern is formed. After that, by conducting the heat treatment at temperature of 400° C. to 1000° C., for example, at 550° C., an ohmic contact is made for the source electrode 33 and the drain electrode 34. A case of forming the resist pattern twice is described above. Alternatively, the resist pattern for forming the opening area to the insulating film 31 is also used as the resist pattern for forming the source electrode 33 and the drain electrode 34. In this case, the resist pattern is formed once. It should be noted that the source electrode 33 and the drain electrode 34 may be formed on the electron transit layer 12.

As described above, according to the second embodiment, a semiconductor device 110 can be fabricated. It should be noted that contents other than the described above are the same as those in the first embodiment.

Third Embodiment

Next, a third embodiment will be described. A method for fabricating a semiconductor device according to the third embodiment will be described with reference to FIG. 8A through FIG. 8H.

Figure 8A:
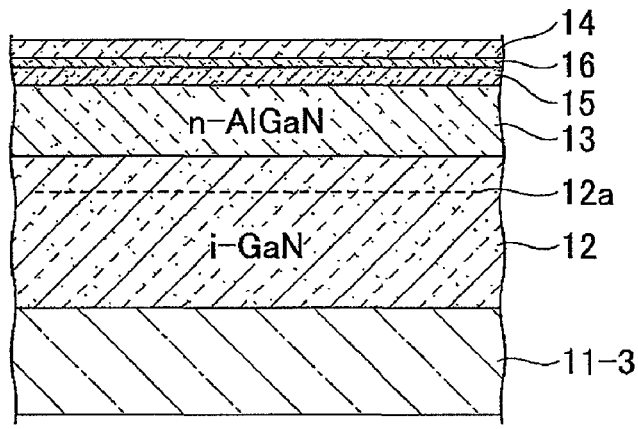
FIG. 8A through FIG. 8H illustrate process steps in a method for fabricating the semiconductor device according to a third embodiment.

First, as illustrated in FIG. 8A, on a substrate 11-3 formed from GaN or the like, by the MOVPE, the electron transit layer 12, the electron supply layer 13, a protective layer 15 formed from n-GaN, a cap layer 16 formed from i-AlN, and a cap layer 14 formed from n-GaN are sequentially formed. It should be noted that these layers are formed due to the epitaxial growth. The electron transit layer 12 to be the first semiconductor layer is formed by i-GaN of approximately 3 μm thickness. The electron supply layer 13 to be the second semiconductor layer is formed by n-AlGaN of approximately 30 nm thickness, and Si as the impurity element is doped so that the impurity concentration becomes $5 \times 10^{18}$ cm$^{-3}$. The protective layer 15 formed from n-GaN is formed to be approximately 10 nm thickness, and Si as the impurity element is doped so that the impurity concentration becomes $5 \times 10^{18}$ cm$^{-3}$. The cap layer 16 formed from i-AlN is formed to be approximately 2 μm thickness. The cap layer 14 to be the third semiconductor layer formed from n-GaN is formed to be approximately 10 nm thickness, and Si as the impurity element is doped so that the impurity concentration becomes $5 \times 10^{18}$ cm$^{-3}$. Accordingly, the 2DEG 12a is formed on the electron transit layer 12 in the vicinity of the interface between the electron transit layer 12 and the electron supply layer 13. After that, the element isolation region, which is not shown, is formed. In detail, the photoresist for forming the element isolation region is applied, and exposed and developed by the exposure device. The resist pattern having the opening area is formed in the area where the element isolation region is formed. After that, the dry etching using the gas including chlorine chemistry is conducted, and the insulating film is formed in the area where the dry etching is conducted. Alternatively, the element isolation region is formed by conducting the ion implantation of the predetermined element.

Figure 8B:
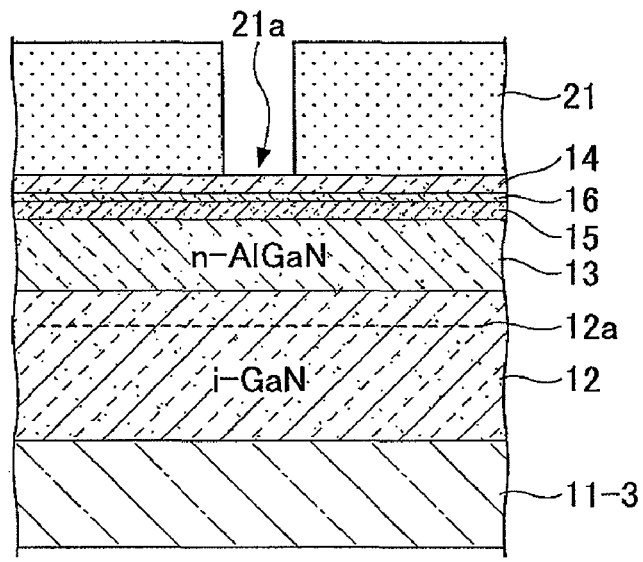

Next, as illustrated in FIG. 8B, the resist pattern 21 is formed on the surface of the cap layer 14. The resist pattern 21 is formed by applying the photoresist on the surface of the cap layer 14, and exposing and developing by the exposure device. Accordingly, the resist pattern 21 is formed to have the opening area 21a in the area where a gate recess 222, which will be described later, is formed.

Figure 8C:
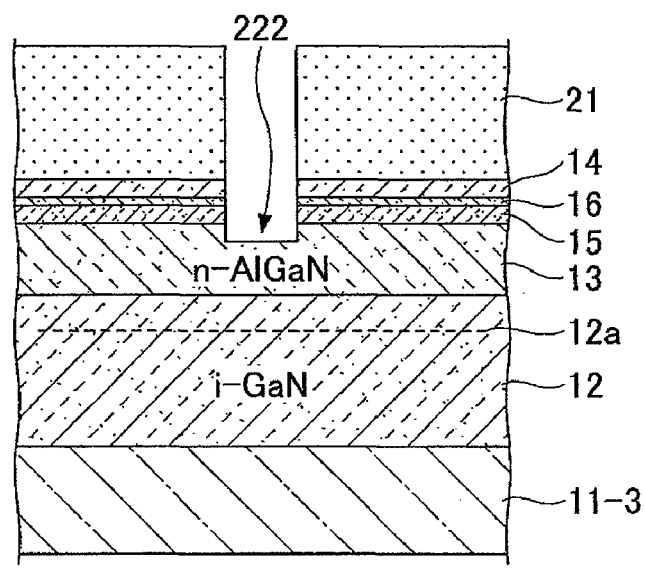

Next, as illustrated in FIG. 8C, by conducting the dry etching such as RIE or the like using the gas including chlorine chemistry, a part of or the entire cap layer 14, the cap layer 16, the protective layer 15, and the electron supply layer 13 are removed in the area where the resist pattern 21 is formed. That is, a part of the entire cap layer 14 formed from n-GaN, the cap layer 16 formed from i-AlN, the protective layer 15 formed from n-GaN, and the electron supply layer 13 are removed in the opening area 21a of the resist pattern 21. Thus, the gate recess 222 is formed.

Figure 8D:
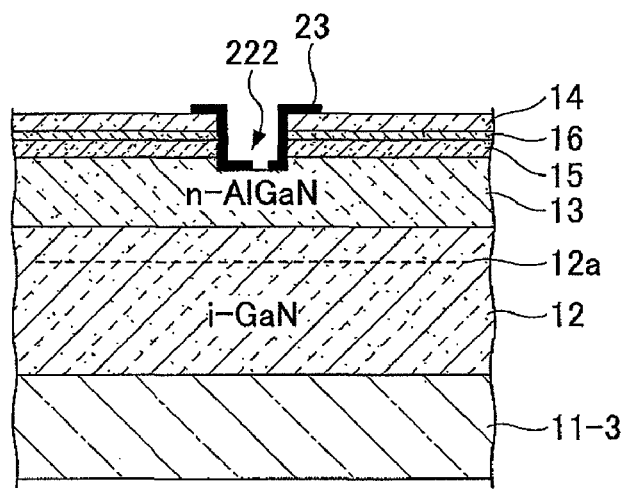

Next, as illustrated in FIG. 8D, the resist pattern 21 is removed by the organic solvent or the like. However, the dry etching residue 23 generated by conducting the dry etching such RIE or the like remains in the state of being attached to the bottom surface, the lateral surfaces, and the like of the gate recess 222.

Figure 8E:
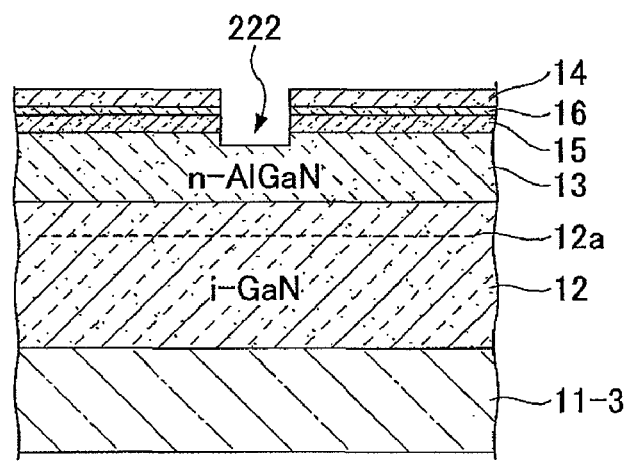

Next, as illustrated in FIG. 8E, by conducting a treatment with sulfuric acid and hydrogen peroxide and hydrofluoric acid treatment, the dry etching residue 23 attached to the bottom surface, the lateral surfaces, and the like of the gate recess 222 is removed. In the dry etching residue 23, the reactive layer is removed by hydrofluoric acid, and a residue other than the reactive layer is removed by sulfuric acid and hydrogen peroxide. The dry etching residue 23 can be removed by the acid treatment, the organic treatment, the water cleaning treatment, the superheated steam treatment, the super critical water treatment, the supercritical CO2 treatment, the heat treatment, the plasma treatment, or the ultraviolet treatment other than the above described method. Also, two or more the above treatments may be combined and successively conducted.

Figure 8F:
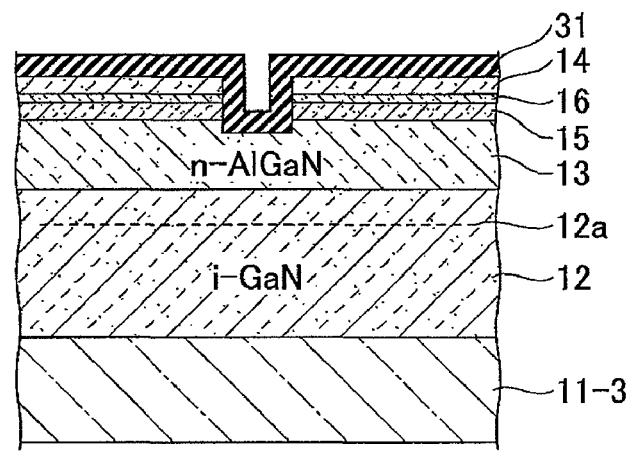

Next, as illustrated in FIG. 8F, the insulating film 31 is formed on the bottom surface and the lateral surfaces of the gate recess 222 and the cap layer 14 formed from n-GaN. In the third embodiment, the insulating film 31 is formed so that a silicon nitride ($Si_2N_4$) film becomes 2 nm to 200 nm in thickness. In detail, the silicon nitride film is formed as the insulating film 31 to be approximately 20 nm in thickness.

Figure 8G:
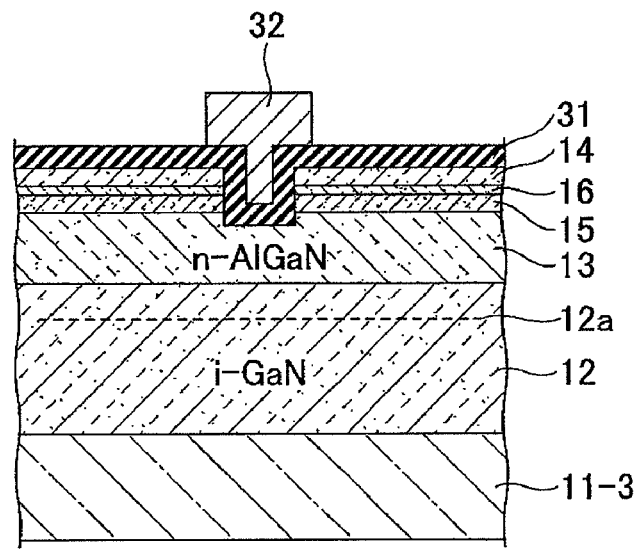

Next, as illustrated in FIG. 8G, on an area where the gate recess 222 is formed, the gate electrode 32 is formed via the insulating film 31. In detail, the photoresist is applied on the insulating film 31, and exposed and developed by the exposure device. The resist pattern (not shown) is formed to have the opening area in the area where the gate electrode 32 is formed. After that, a Ni film having approximately 30 nm thickness and an Au film having approximately 400 nm thickness are sequentially formed by the vacuum vapor deposition. Thus, the metal film is formed. Moreover, after that, by conducting the lift-off using the organic solvent or the like, the metal film formed on the resist pattern (not shown) is removed with the resist pattern, and the gate electrode 32 is formed by the metal film formed on the area where the resist pattern is formed.

Figure 8H:
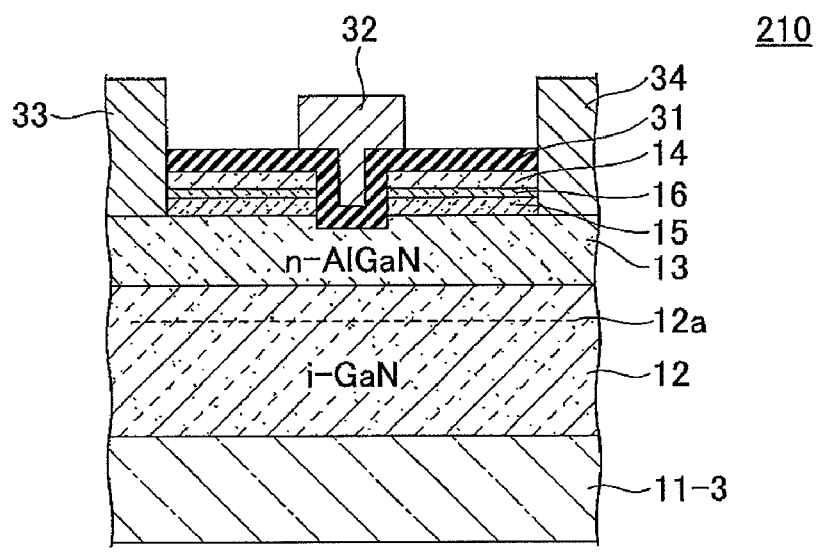

Next, as illustrated in FIG. 8H, the source electrode 33 and the drain electrode 34 are formed. In detail, the photoresist is applied on the surface of the insulating film 31, and the exposed and developed by the exposure device. Thus, the resist pattern (not shown) having the opening area is formed on the area where the source electrode 33 and the drain electrode 34 are formed. After that, the dry etching such as RIE or the like using the gas including the chlorine chemistry. The insulating film 31, the cap layer 14 formed from n-GaN, the cap layer 16 formed from i-AlN, and the protective layer 15 formed from n-GaN are removed in the area where the resist pattern is not formed. Then, the electron supply layer 13 is exposed and the opening area is formed. After that, the resist pattern is removed. The photoresist is applied again on the surface and the like of the insulating film 31, and exposed and developed by the exposure device. The resist pattern (not shown) having the opening area is formed on the area where the source electrode 33 and the drain electrode 34.

After that, a Ta film having approximately 20 nm thickness and an Al film having approximately 200 nm thickness are sequentially formed by the vacuum vapor deposition, thereby forming the metal film. After that, by conducting the lift-off using the organic solvent or the like, the metal film formed on the resist pattern is removed with the resist pattern. The source electrode 33 and the drain electrode 34 are formed by the metal film formed on the area where the resist pattern is formed. After that, by conducting the heat treatment at temperature of 400° C. to 1000° C., for example, at 550° C., an ohmic contact is made for the source electrode 33 and the drain electrode 34. A case of forming the resist pattern twice is described above. Alternatively, the resist pattern for forming the opening area to the insulating film 31 is also used as the resist pattern for forming the source electrode 33 and the drain electrode 34. In this case, the resist pattern is formed once. It should be noted that the source electrode 33 and the drain electrode 34 may be formed on the electron transit layer 12.

As described above, according to the third embodiment, a semiconductor device 210 can be fabricated. It should be noted that contents other than the described above are the same as those in the first embodiment.

Fourth Embodiment

Next, a fourth embodiment will be described. A method for fabricating a semiconductor device according to the fourth embodiment will be described with reference to FIG. 9A through FIG. 9H.

Figure 9A:
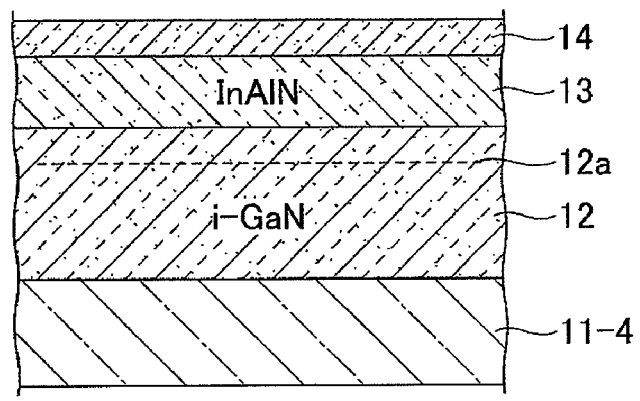
FIG. 9A through FIG. 9H illustrate process steps in a method for fabricating the semiconductor device according to a fourth embodiment.

First, as illustrated in FIG. 9A, on a substrate 11-4 formed from sapphire ($Al_2O_3$) or the like, by the MOVPE, the electron transit layer 12 to be the first semiconductor layer, the electron supply layer 13 to be the second semiconductor layer, and the cap layer 14 to be the third semiconductor layer are sequentially formed. It should be noted that these layers are formed due to the epitaxial growth. The electron transit layer 12 is formed by an approximately 3 μm i-GaN thickness. The electron supply layer 13 is formed by an approximately 3 nm i-InAlN thickness. For the electron supply layer 13, the impurity element is not doped. However, for example, n-InAlN or the like, in which Si doped as the impurity element so that the impurity concentration becomes $5\times10^{18}$ $cm^{-3}$, can be used. The cap layer 14 is formed by an approximately 10 nm n-GaN thickness. Si is doped as the impurity element so that the impurity concentration becomes $5\times10^{18}$ $cm^{-3}$. Accordingly, the 2DEG 12a is formed on the electrode transit layer 12 in the vicinity of the interface between the electrode transit layer 12 and the electrode supply layer 13. After that, the element isolation region (not shown) is formed. In detail, the photoresist is applied to form the element isolation region, and exposed and developed by the exposure device. Thus, the resist pattern having the opening area is formed in the area where the element isolation region is formed. Furthermore, after that, the dry etching using the gas including the chlorine chemistry is conducted, and the insulating film is formed in the area where the dry etching is conducted. Alternatively, the element isolation region may be formed by conducting the ion implantation of the predetermined element.

Figure 9B:
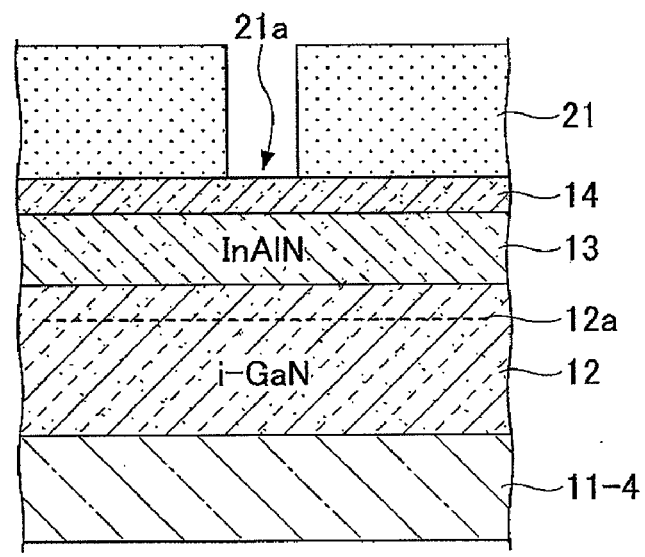

Next, as illustrated in FIG. 9B, the resist pattern 21 is formed on the surface of the cap layer 14 by applying the photoresist on the surface of the cap layer 14, and exposing and developing by the exposure device. Thus, the resist pattern is formed to have the opening area 21a in the area where a gate recess 223, which will be described later, is formed.

Figure 9C:
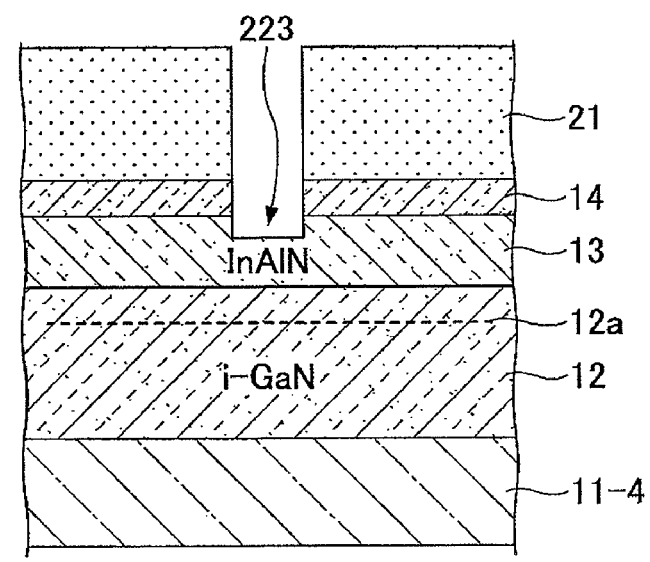

Next, as illustrated in FIG. 9C, by conducting the dry etching such as RIE or the like using the gas including the chlorine chemistry, the area where the resist pattern 21 is not formed, that is, a part of or the entire cap layer 14 and the electron supply layer 13 in the opening area 21a are removed. The gate recess 223 is formed.

Figure 9D:
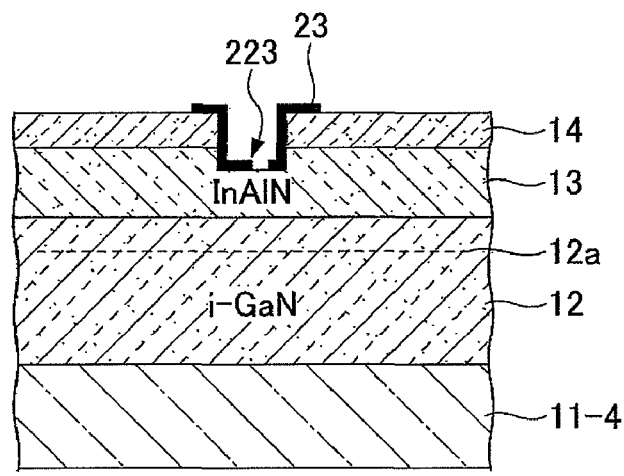

Next, as illustrated in FIG. 9D, the resist pattern 21 is removed by the organic solvent or the like. However, the dry etching residue 23 generated by conducting RIE or the like remains in the state of being attached to the bottom surface, the lateral surfaces, and the like of the gate recess 223.

Figure 9E:
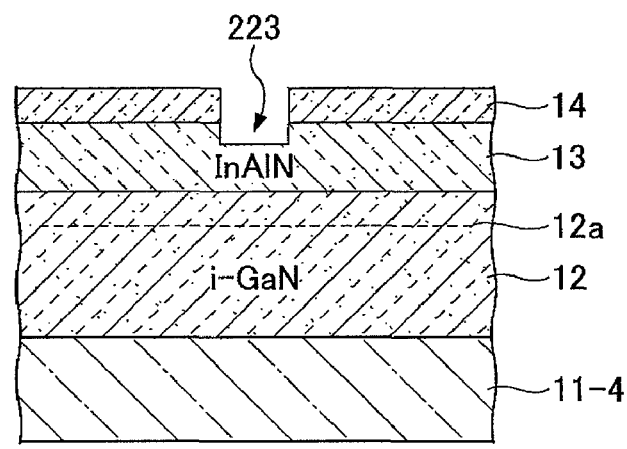

Next, as illustrated in FIG. 9E, after a pre-treatment (the organic treatment) by a NMP (N-Methyl-2-Pyrrolidone), a treatment by sulfuric acid and hydrogen peroxide and a hydrofluoric acid treatment are conducted. By these treatments, the dry etching residue 23 attached to the bottom surface, the lateral surfaces, and the like of the gate recess 223 is removed. In the dry etching residue 23, the reactive layer is removed by hydrofluoric acid, and a residue other than is removed by sulfuric acid and hydrogen peroxide. The dry etching residue 23 can be removed by the acid treatment, the organic treatment, the water cleaning treatment, the superheated steam treatment, the super critical water treatment, the supercritical CO2 treatment, the heat treatment, the plasma treatment, or the ultraviolet treatment other than the above described method. Also, two or more the above treatments may be combined and successively conducted.

Figure 9F:
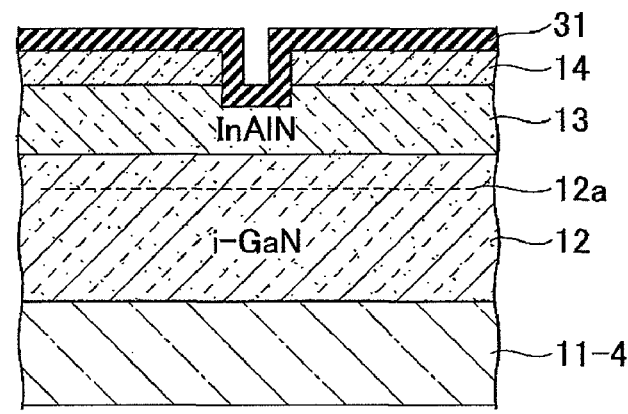

Next, as illustrated in FIG. 9F, the insulating film 31 is formed on the bottom surface and the lateral surfaces of the gate recess 223 and the electron supply layer 13. In the fourth embodiment, the insulating film 31 is formed so that a HfAlO film is formed with 2 nm to 200 nm in thickness. In detail, the HfAlO film is formed with 10 nm in thickness, as the insulating film 31.

Figure 9G:
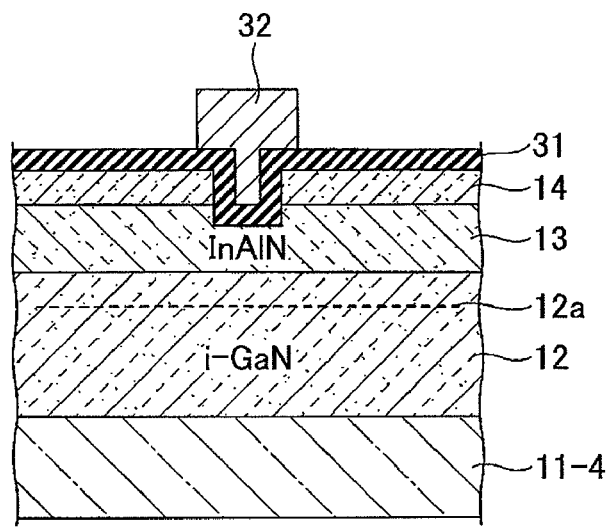

Next, as illustrated in FIG. 9G, the gate electrode 32 is formed via the insulating film 31 on the area where the gate recess 223 is formed. In detail, the photoresist is applied on the insulating film 31 and is exposed and developed by the exposure device. The resist pattern (not shown) having the opening area in the area where the gate electrode 32 is formed. After that, the Ni film having approximately 30 nm thickness and the Au film having approximately 400 nm thickness are sequentially formed by the vacuum vapor deposition, thereby forming the metal film. Furthermore, after that, the metal film formed on the resist pattern is removed with the resist pattern by a lift-off using the organic solvent or the like. Thus, the gate electrode 32 is formed by the metal film formed on the area where the resist pattern is not formed.

Figure 9H:
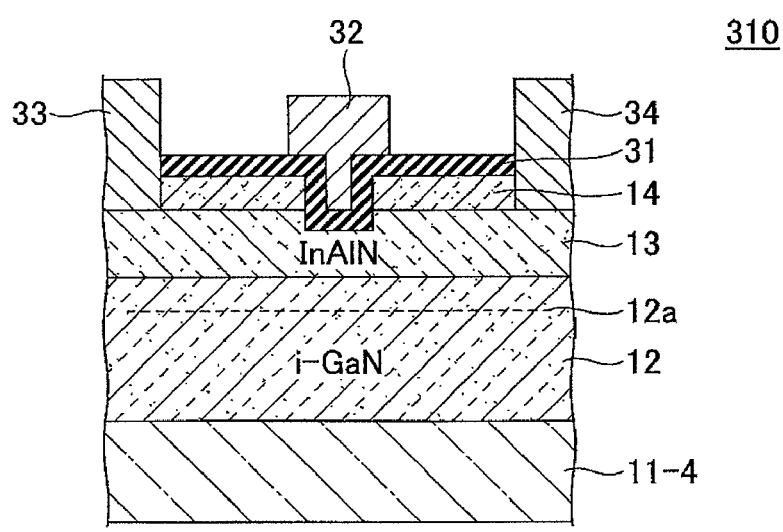

Next, as illustrated in FIG. 9H, the source electrode 33 and the drain electrode 34 are formed. In detail, the photoresist is applied on the surface of the insulating film 31, the resist pattern (not shown) having the opening area in the area where the source electrode 33 and the drain electrode 34 are formed by exposing and developing by the exposure device. After that, by conducting the dry etching such as RIE or the like using the gas including the chlorine chemistry, the insulating film 31 and the cap layer 14 in the area where the resist pattern is formed are removed, the electron supply layer 13 is exposed, so that the opening area is formed. After that, the resist pattern is removed, the photoresist is applied on the surface and the like of the insulating film 31. The photoresist is exposed and developed by the exposure device. A resist pattern (not shown), which has an opening area in the area where the source electrode 33 and the drain electrode 34 are formed, is formed.

As described above, according to the second embodiment, a semiconductor device 310 can be fabricated. It should be noted that contents other than the described above are the same as those in the first embodiment.

Fifth Embodiment

Next, a fifth embodiment will be described. A method for fabricating a semiconductor device according to the third embodiment will be described with reference to FIG. 10A through FIG. 10H.

Figure 10A:
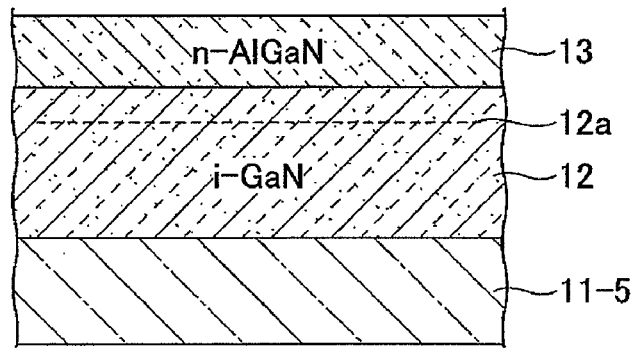
FIG. 10A through FIG. 10H illustrate process steps in a method for fabricating the semiconductor device according to a fifth embodiment.

First, as illustrated in FIG. 10A, on a substrate 11-5 formed from SiC or the like being semi-insulative, due to epitaxial growth by the MOVPE, a semiconductor layer is formed by sequentially forming an electron transit layer 12 to be a first semiconductor layer, and an electron supply layer 13 to be a second semiconductor layer. The electron transit layer 12 is formed from i-GaN having approximately 3 µm in thickness. The electron supply layer 13 is formed from n-AlGaN having approximately 30 nm. Si as an impurity element is doped so that an impurity concentration becomes $5 \times 10^{18}$ cm$^{-3}$. A 2DEG 12a is formed on the electron transit layer 12 in a vicinity of the interface between the electron transit layer 12 and the electron supply layer 13. After that, an element isolation region (not shown) is formed. In detail, a photoresist is applied to form the element isolation region. Then, by exposing and developing by the exposure device, a resist pattern having an opening area is formed on an area where the element isolation region is formed. Furthermore, after that, a dry etching using the gas including the chlorine chemistry is conducted. By forming an insulating film or conducting an ion implantation of a predetermined element to an area where the dry etching is conducted, the element isolation region is formed.

Figure 10B:
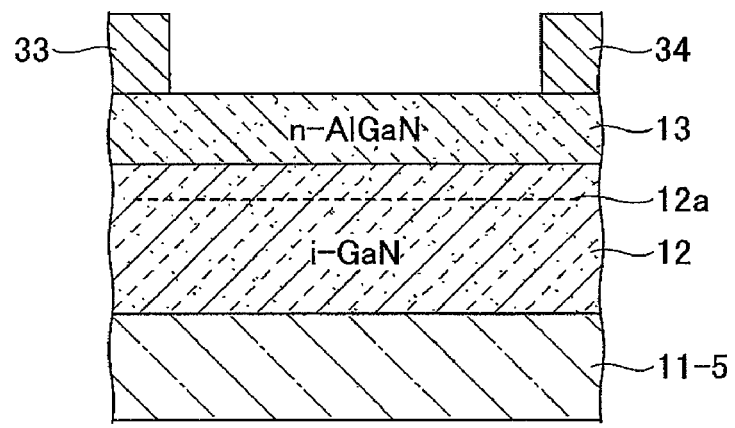

Next, as illustrated in FIG. 10B, the source electrode 33 and the drain electrode 34 are formed. In detail, the photoresist is applied on the surface of the electron supply layer, and is exposed and developed by the exposure device. The resist pattern (not shown) having the opening area is formed on the area where source electrode 33 and the drain electrode 34 are formed. After that, a Ta film having approximately 20 nm thickness and an Al film having approximately 200 nm thickness are sequentially formed by the vacuum vapor deposition, thereby forming the metal film. After that, by conducting the lift-off using the organic solvent or the like, the metal film formed on the resist pattern is removed with the resist pattern, and the source electrode 33 and the drain electrode 34 are formed by the metal film formed on the area where the resist pattern is not formed. After that, by conducting the heat treatment at temperature of 400° C. to 1000° C., for example, at 550° C., the ohmic contact is made for the source electrode 33 and the drain electrode 34. The source electrode 33 and the drain electrode 34 are formed on the electron transit layer 12.

Figure 10C:
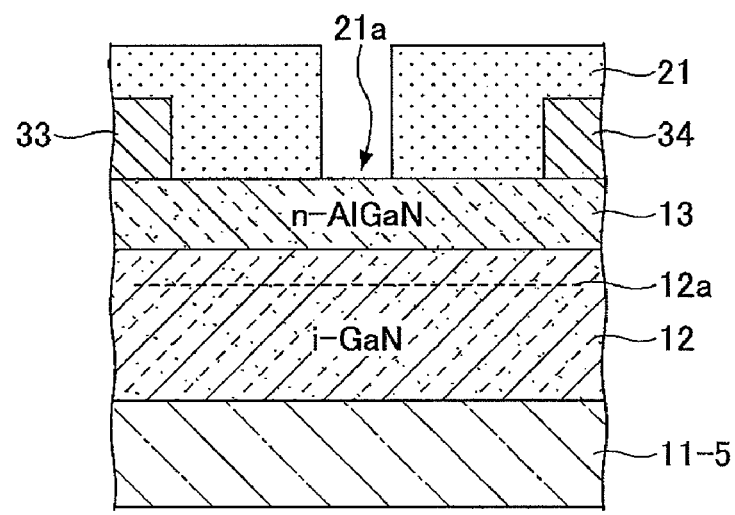

Next, as illustrated in FIG. 10C, the resist pattern 21 is formed to form the gate recess 22. The photoresist is applied on the surface of the electron supply layer 13, and exposed and developed by the exposure device. Thus, the resist pattern 21 is formed to have the opening area 21a in the area where the gate recess 22 is formed.

Figure 10D:
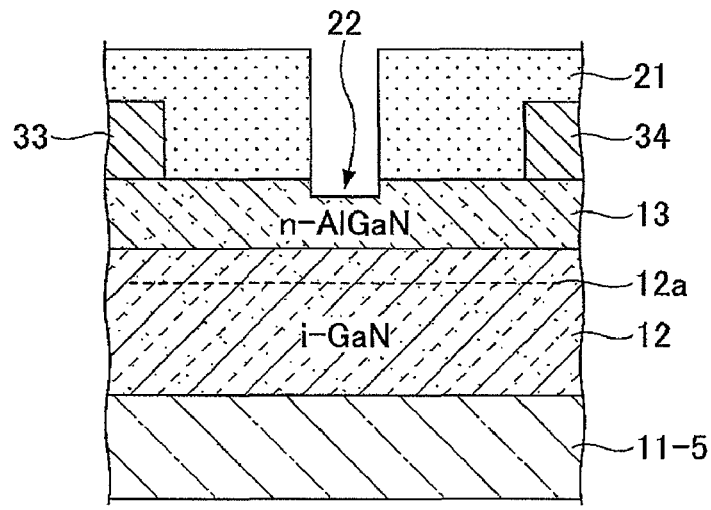

Next, as illustrated in FIG. 10D, by conducting the dry etching such as RIE or the like using the gas including the chlorine chemistry, the area where the resist pattern 21 is not formed, that is, a part or the entire electron supply layer 13 is removed in the opening area 21a. The gate recess 22 is formed.

Figure 10E:
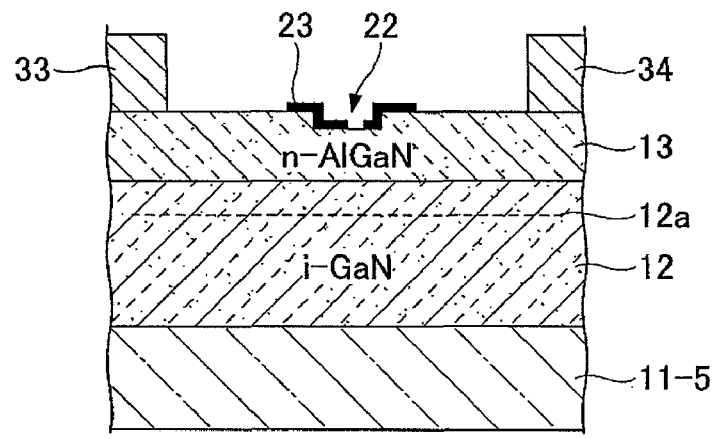

Next, as illustrated in FIG. 10E, the resist pattern 21 is removed by the organic solvent or the like. However, the dry etching residue 23 generated by conducting RIE or the like remains in the state of being attached to the bottom surface, the lateral surfaces, and the like of the gate recess 22.

Figure 10F:
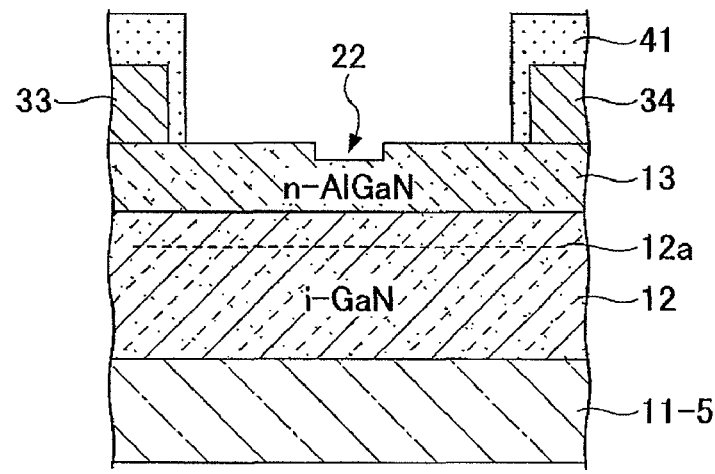

Next, as illustrated in FIG. 10F, after a protective film 41 is formed to cover the source electrode 33 and the drain electrode 34, the dry etching residue 23 attached to the bottom surface, the lateral surfaces, and the like of the gate recess 222 is removed by conducting the treatment by the sulfuric acid and hydrogen peroxide and the hydrofluoric acid treatment. In detail, the photoresist is applied on an area including the source electrode 33 and the drain electrode 34, and exposed and developed by the exposure device. The protective film 41 formed by the resist pattern is formed so that the entire source electrode 33 and the drain electrode 34 are covered. After that, by conducting the treatment by the sulfuric acid and hydrogen peroxide and the hydrofluoric acid treatment, the dry etching residue 23 attached to the bottom surface, the lateral surfaces, and the like of the gate recess 222 is removed. Since the source electrode 33 and the drain electrode 34 are covered with the protective film 41 formed from the resist pattern, the source electrode 33 and the drain electrode 34 are not influenced when the dry etching residue 23 is removed. Alternatively, the dry etching residue 23 can be removed by an acid treatment, an organic treatment, a water cleaning treatment, a superheated steam treatment, a super critical water treatment, a supercritical CO2 treatment, a heat treatment, a plasma treatment, or a ultraviolet treatment. Also, the above-described treatments can be combined by two or more.

Figure 10G:
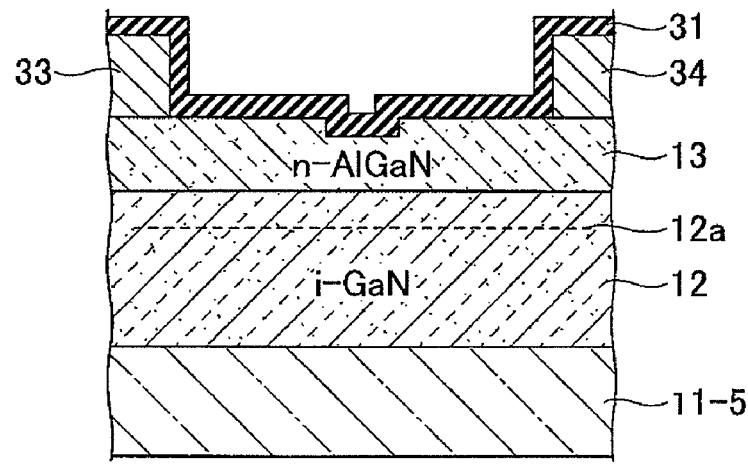

Next, as illustrated in FIG. 10G, the insulating film 31 is formed on the surface of the electron supply layer 13 formed from n-AlGaN and on the gate recess 22. In the fifth embodiment, the insulating film 31 is formed so that the alumina ($Al_2O_3$) film is 2 nm to 200 nm in thickness. In detail, the alumina film is formed with approximately 10 nm thickness as the insulating film 31. As the method for forming the insulating film 31, CVD (Chemical Vapor Deposition), ALD (Atomic Layer Deposition), sputtering, and the like can be applied.

Figure 10H:
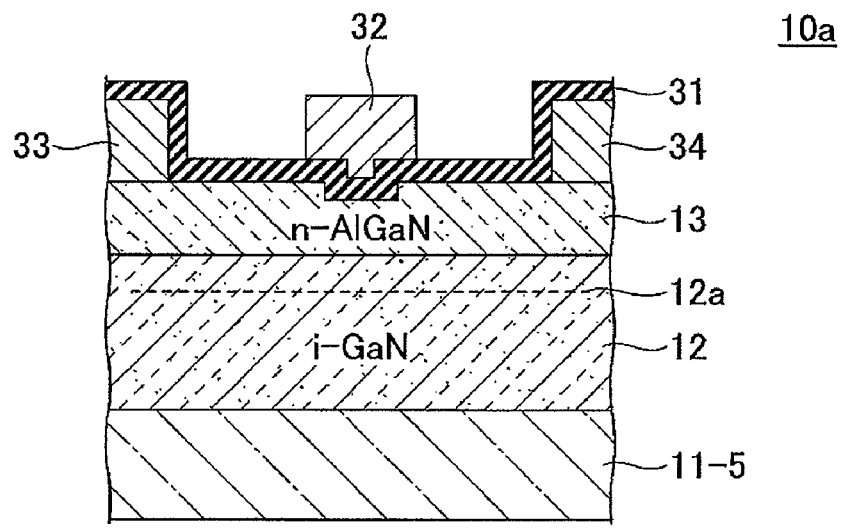

Next, as illustrated in FIG. 10H, on the area where the gate recess 22 is formed, the gate electrode 32 is formed via the insulating film 31. In detail, the photoresist is applied on the insulating film 31, and exposed and developed by the exposure device. Thus, the resist pattern (not shown) is formed to have the opening area in the area where the gate electrode 32 is formed. After that, the Ni film having approximately 30 nm thickness and the Au film having approximately 400 nm thickness are sequentially formed by vacuum vapor deposition, thereby forming the metal film. After that, the metal film formed on the resist pattern is removed with the resist pattern by conducting the lift-off using the organic solvent or the like. Thus, the gate electrode 32 is formed by the metal film formed on the area where the resist pattern is not formed.

As described above, according to the fifth embodiment, a semiconductor device 10a can be fabricated. It should be noted that contents other than the described above are the same as those in the first embodiment.

Sixth Embodiment

Figure 11:
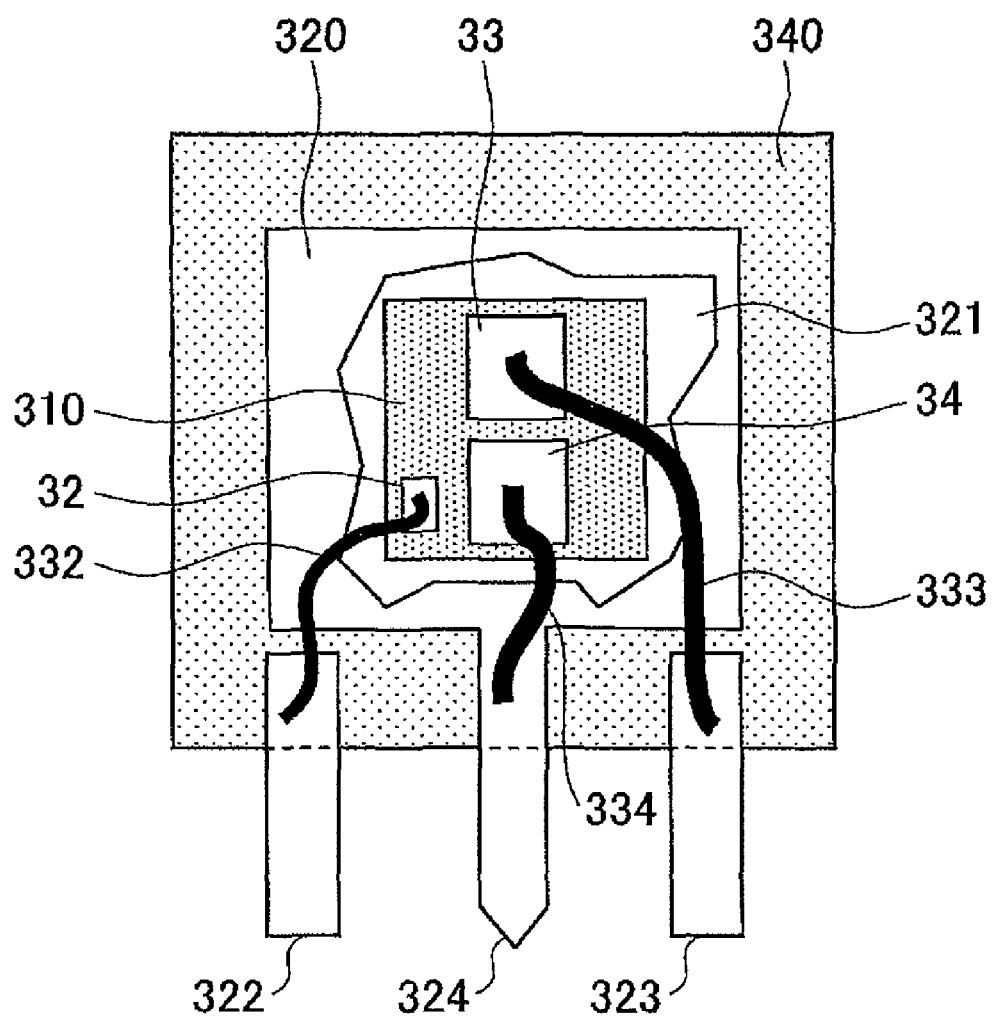
FIG. 11 is a diagram for explaining a semiconductor device fabricated as a discrete package according to a sixth embodiment.

Next, a sixth embodiment will be described. In the sixth embodiment, a semiconductor device is fabricated according to any one of the first through fifth embodiments, to be a discrete package. The semiconductor device fabricated to be the discrete package will be described with reference to FIG. 11. FIG. 11 schematically illustrates inside of the semiconductor device fabricated to be the discrete package. In FIG. 11, an arrangement of electrodes is different from that illustrated in the first through fifth embodiments.

First, by cutting the semiconductor device fabricated in any one of the first through fifth embodiments by dicing, a semiconductor chip 310 of the HEMT of a GaN semiconductor material is formed. The semiconductor chip 310 is fixed on the lead frame 320 by a die attach adhesive 321 such as a solder or the like.

Next, the gate electrode 32 is connected to a gate lead 322 by a bonding wire 332, the source electrode 33 is connected to a source lead 323 by a bonding wire 333, and the drain electrode 34 is connected to the drain lead 234 by a bonding wire 334. It should be noted that the bonding wires 332, 333, and 334 are formed by a metal material such as Al or the like.

Next, a plastic molding is conducted by using a mold resin 340 in a transfer molding method. As described above, it is possible to fabricate the semiconductor device packaged to be a discrete device of the HEMT using the GaN semiconductor material.

Figure 12:
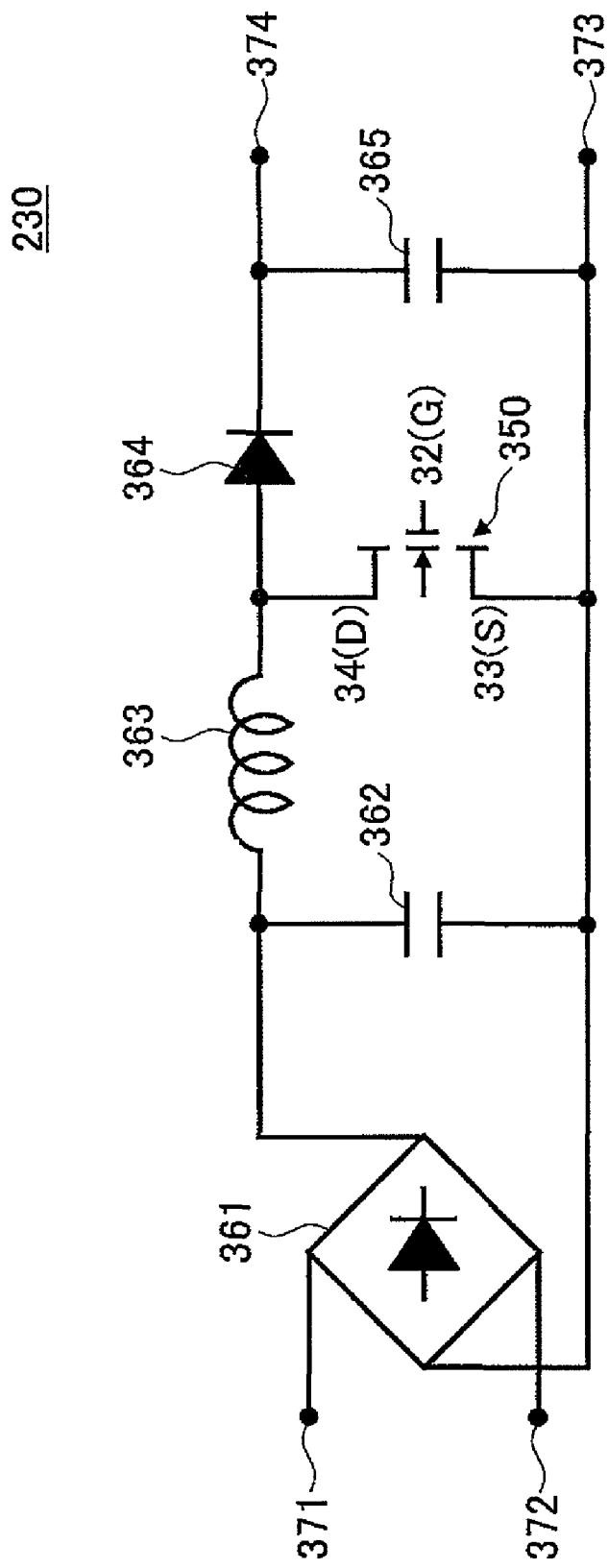
FIG. 12 is a diagram illustrating a PFC circuit in the sixth embodiment.

Next, a PFC (Power Factor Correction) circuit 230 using a HEMT 350 of the GaN semiconductor material, which is regarded as the semiconductor device fabricated in any one of the first through fifth embodiments, will be described with reference to FIG. 12. The PFC circuit 230 is formed on a circuit substrate (not shown), and includes a diode bridge 361, a first capacitor 362, a choke coil 363, a diode 364, and a second capacitor 365, in addition to the HEMT 350. An input side of the diode bridge 361 is connected to an alternating current (AC) power source through input terminals 371 and 372.

One terminal at an output side of the diode bridge 361 is connected to one terminal of the first capacitor 362, a source electrode 33(S) of the HEMT 350, one terminal of the second capacitor 365, and the output terminal 373. Also, another terminal at the output side of the diode bridge 361 is connected to another terminal of the first capacitor 362, and one terminal of the choke coil 363. The another terminal of the choke coil 363 is connected to a drain electrode 34(D) of the HEMT 350, and an anode terminal of the diode 364. The cathode terminal of the diode 364 is connected to another terminal of the second capacitor 365, and an output terminal 374. It should be noted that a gate electrode 32(G) of the HEMT 350 is connected to a gate driver (not shown). In the PFC circuit 230, a direct current (DC) power source can be acquired through the output terminals 373 and 374. A circuit such as the PFC circuit 230 is embedded and used in a server power source or the like. By implementing the PFC circuit 230, a harmonic component can be removed, and a power factor can be improved.

In the PFC circuit 230 in the sixth embodiment, since the semiconductor device in any one of the first through fifth embodiments having a uniform characteristic and a high yield ratio is used, it is possible to conduct power supply by lower expense and at higher reliability.

According to the above-described embodiments, it is possible to fabricate the semiconductor device in which the threshold voltage changes less and an uniform characteristic can be acquired. Also, it is possible to improve the yield ratio of the semiconductor device to be fabricated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for fabricating a semiconductor device, comprising:
    forming a resist pattern on a surface of a semiconductor layer in which a first layer and a second layer are sequentially formed on a substrate;
    forming a gate recess by removing a part or the entire second layer in an opening area of the resist pattern;
    removing the resist pattern;
    removing a dry etching residue attached to a bottom surface and lateral surfaces of the gate recess after the resist pattern is removed;
    forming an insulating film on the bottom surface, the lateral surfaces, and the semiconductor layer after the dry etching residue is removed;
    forming a gate electrode via the insulating film on an area where the gate recess is formed; and
    forming a source electrode and a drain electrode on the semiconductor layer.

2. The method as claimed in claim 1, wherein the semiconductor layer includes a third layer formed on the second layer, and the gate recess is formed by removing the entire third layer and a part of or the entire second layer.

3. The method as claimed in claim 2, wherein a n-GaN layer is formed on the second layer, an AlN layer is formed on the n-GaN layer, and the third layer is formed on the AlN layer.

4. The method as claimed in claim 1, wherein the dry etching residue is removed by one or more treatments selected from an acid treatment, an alkali treatment, an organic treatment, a water cleaning treatment, a superheated steam treatment, a super critical water treatment, a supercritical CO2 treatment, a heat treatment, a plasma treatment, and an ultraviolet treatment.

5. The method as claimed in claim 4, wherein the acid treatment is conducted by one or more compounds selected from hydrochloric acid, hydrofluoric acid, nitric acid, sulfuric acid, phosphoric acid, boric acid, and mixtures of any of the acids with hydrogen peroxide.

6. The method as claimed in claim 4, wherein the alkali treatment is conducted by one or more selected from potassium hydroxide, sodium hydroxide, ammonia, calcium hydroxide, tetramethyl ammonium hydroxide, and mixtures of any of the alkalis with hydrogen peroxide.

7. The method as claimed in claim 4, wherein the organic treatment is conducted by one or more selected from alcohols, aldehydes, ketones, carboxylic acids, and derivatives thereof.

8. The method as claimed in claim 4, wherein the heat treatment, the plasma treatment, and the ultraviolet treatment are conducted within a device used when the insulating film is formed.

9. The method as claimed in claim 1, wherein the dry etching residue is removed by two or more treatments selected from an acid treatment, an alkali treatment, an organic treatment, a water cleaning treatment, a superheated steam treatment, a super critical water treatment, a supercritical CO2 treatment, a heat treatment, a plasma treatment, and an ultraviolet treatment, in which the two or more treatments are successively conducted.

10. The method as claimed in claim 1, wherein the semiconductor layer is formed due to an epitaxial growth.

11. The method as claimed in claim 1, wherein the semiconductor layer is formed by a nitride semiconductor.

12. The method as claimed in claim 1, wherein the first layer includes i-GaN.

13. The method as claimed in claim 1, wherein the second layer includes either one of AlGaN and InAlN.

14. The method as claimed in claim 1, further comprising:
exposing the semiconductor layer by removing the insulating film in an area where the source electrode and the drain electrode are formed after the gate electrode is formed; and
forming the source electrode and the drain electrode in an area where the semiconductor is exposed.

15. The method as claimed in claim 14, wherein the source electrode and the drain electrode are formed on the first layer and the second layer.

16. The method as claimed in claim 1, wherein the source electrode and the drain electrode are formed on the semiconductor layer before a resist pattern is formed on the semiconductor layer,
after the resist pattern is removed, a protective film for protecting the source electrode and the drain electrode is formed, and
after the protective film is formed, the dry etching residue is removed.

17. The method as claimed in claim 1, wherein the dry etching is conducted by using gas including chlorine chemistry.

18. The method as claimed in claim 1, wherein the insulating film is formed by one or more materials selected from oxides, nitrides, or oxynitrides of Si, Al, Hf, Zr, Ti, Ta, and W.

19. The method as claimed in claim 1, wherein the semiconductor device is a High Electron Mobility Transistor.

20. A method for fabricating a semiconductor device, comprising:
forming a resist pattern on a surface of a semiconductor layer in which a first layer, a second layer, and a third layer are sequentially formed on a substrate;
forming a gate recess by removing a part or the entire third layer in an opening area of the resist pattern;
removing the resist pattern;
removing a dry etching residue attached to a bottom surface and lateral surfaces of a gate recess after the resist pattern is removed;
forming an insulating film on the bottom surface, the lateral surfaces, and the semiconductor layer after the dry etching residue is removed;
forming a gate electrode via the insulating film on an area where the gate recess is formed; and
forming a source electrode and a drain electrode on the semiconductor layer.

* * * * *